(12) United States Patent  
Milano et al.

(10) Patent No.: US 10,753,963 B2  
(45) Date of Patent: *Aug. 25, 2020

(54) CURRENT SENSOR ISOLATION

(71) Applicant: Allegro MicroSystems, LLC, Manchester, NH (US)

(72) Inventors: Shaun D. Milano, Dunbarton, NH (US); Shixi Louis Liu, Hooksett, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/426,215

(22) Filed: May 30, 2019

(65) Prior Publication Data

US 2019/0277889 A1    Sep. 12, 2019

Related U.S. Application Data

(60) Division of application No. 15/179,147, filed on Jun. 10, 2016, now Pat. No. 10,345,343, which is a (Continued)

(51) Int. Cl.  
*G01R 15/20* (2006.01)  
*H01L 43/02* (2006.01)  
(Continued)

(52) U.S. Cl.  
CPC .......... *G01R 15/20* (2013.01); *G01R 15/207* (2013.01); *G01R 19/0092* (2013.01); (Continued)

(58) Field of Classification Search  
CPC .... G01R 33/0052; G01R 33/07; G01R 33/09; G01R 15/20; G01R 15/207; H01L 43/02; H01L 43/04; H01L 43/065; H01L 43/08  
See application file for complete search history.

(56) References Cited

U.S. PATENT DOCUMENTS 4,425,596 A    1/1984  Satou  
4,893,073 A    1/1990  McDonald et al.  
(Continued)

FOREIGN PATENT DOCUMENTS

CN    1412843 A    4/2003  
CN    1842711 A    10/2006  
(Continued)

OTHER PUBLICATIONS

Korean Office Action (with English Translation) dated Jan. 2, 2020 for Korean Application No. 10-2015-7029244; 13 Pages.

(Continued)

*Primary Examiner* — Sue A Purvis  
*Assistant Examiner* — Scott Stowe  
(74) *Attorney, Agent, or Firm* — Daly, Crowley, Mofford & Durkee, LLP

(57) ABSTRACT

A current sensor integrated circuit includes a lead frame having a primary conductor and at least one secondary lead, a semiconductor die disposed adjacent to the primary conductor, an insulation structure disposed between the primary conductor and the semiconductor die, and a non-conductive insulative material enclosing the semiconductor die, the insulation structure, a first portion of the primary conductor, and a first portion of the at least one secondary lead to form a package. The first portion of the at least one secondary lead (between a first end proximal to the primary conductor and a second end proximal to the second, exposed portion of the at least one secondary lead) has a thickness that is less than a thickness of the second, exposed portion of the least one secondary lead. A distance between the second, exposed portion of the primary conductor and the second, exposed portion of the at least one secondary lead is at least 7.2 mm.

21 Claims, 14 Drawing Sheets

Related U.S. Application Data continuation-in-part of application No. 14/877,309, filed on Oct. 7, 2015, now Pat. No. 9,865,807, which is a division of application No. 13/834,617, filed on Mar. 15, 2013, now Pat. No. 9,190,606.

(51) Int. Cl.

| | | |
|---|---|---|
| *H01L 43/04* | (2006.01) | |
| *H01L 43/06* | (2006.01) | |
| *H01L 43/08* | (2006.01) | |
| *G01R 19/00* | (2006.01) | |
| *G01R 33/00* | (2006.01) | |
| *G01R 33/09* | (2006.01) | |
| *H01L 21/48* | (2006.01) | |
| *G01R 33/07* | (2006.01) | |
| *H01L 23/00* | (2006.01) | |
| *H01L 23/495* | (2006.01) | |

(52) U.S. Cl.
CPC ......... *G01R 33/0052* (2013.01); *G01R 33/07* (2013.01); *G01R 33/09* (2013.01); *H01L 21/4828* (2013.01); *H01L 23/49506* (2013.01); *H01L 24/29* (2013.01); *H01L 24/73* (2013.01); *H01L 43/02* (2013.01); *H01L 43/04* (2013.01); *H01L 43/065* (2013.01); *H01L 43/08* (2013.01); *G01R 15/202* (2013.01); *H01L 23/49541* (2013.01); *H01L 23/49548* (2013.01); *H01L 23/49558* (2013.01); *H01L 24/13* (2013.01); *H01L 24/16* (2013.01); *H01L 24/32* (2013.01); *H01L 24/48* (2013.01); *H01L 24/49* (2013.01); *H01L 24/81* (2013.01); *H01L 2224/131* (2013.01); *H01L 2224/13022* (2013.01); *H01L 2224/16245* (2013.01); *H01L 2224/2919* (2013.01); *H01L 2224/29084* (2013.01); *H01L 2224/32245* (2013.01); *H01L 2224/48091* (2013.01); *H01L 2224/48105* (2013.01); *H01L 2224/48247* (2013.01); *H01L 2224/49171* (2013.01); *H01L 2224/73103* (2013.01); *H01L 2224/73265* (2013.01); *H01L 2224/81801* (2013.01); *H01L 2924/00014* (2013.01); *H01L 2924/07025* (2013.01); *H01L 2924/10252* (2013.01); *H01L 2924/10253* (2013.01); *H01L 2924/10329* (2013.01); *H01L 2924/10332* (2013.01); *H01L 2924/15162* (2013.01); *H01L 2924/181* (2013.01)

(56) References Cited

U.S. PATENT DOCUMENTS

| | | |
|---|---|---|
| 5,041,780 A | 8/1991 | Rippel |
| 5,124,642 A | 6/1992 | Marx |
| 5,247,202 A | 9/1993 | Popovic et al. |
| 5,442,228 A | 8/1995 | Pham et al. |
| 5,561,366 A | 10/1996 | Takahashi et al. |
| 5,615,075 A | 3/1997 | Kim |
| 6,005,383 A | 12/1999 | Savary et al. |
| 6,150,714 A | 11/2000 | Andreycak et al. |
| 6,252,389 B1 | 6/2001 | Baba et al. |
| 6,316,931 B1 | 11/2001 | Nakagawa et al. |
| 6,323,634 B1 | 11/2001 | Nakagawa et al. |
| 6,356,068 B1 | 3/2002 | Steiner et al. |
| 6,411,078 B1 | 6/2002 | Nakagawa et al. |
| 6,424,018 B1 | 7/2002 | Ohtsuka |
| 6,445,171 B2 | 9/2002 | Sandquist et al. |
| 6,462,531 B1 | 10/2002 | Ohtsuka |
| 6,545,456 B1 | 4/2003 | Radosevich et al. |
| 6,566,856 B2 | 5/2003 | Sandquist et al. |
| 6,583,572 B2 | 6/2003 | Veltrop et al. |
| 6,642,705 B2 | 11/2003 | Kawase |
| 6,667,682 B2 | 12/2003 | Wan et al. |
| 6,683,448 B1 | 1/2004 | Olitsuka |
| 6,727,683 B2 | 4/2004 | Goto et al. |
| 6,759,841 B2 | 7/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtsuka |
| 6,841,989 B2 | 1/2005 | Goto et al. |
| 6,853,178 B2 | 2/2005 | Hayat-Dawoodi |
| 6,867,573 B1 | 3/2005 | Carper |
| 6,921,955 B2 | 7/2005 | Goto |
| 6,989,665 B2 | 1/2006 | Goto |
| 6,995,315 B2 | 2/2006 | Sharma et al. |
| 7,006,749 B2 | 2/2006 | Illich et al. |
| 7,075,287 B1 | 7/2006 | Mangtani et al. |
| 7,166,807 B2 | 1/2007 | Gagnon et al. |
| 7,248,045 B2 | 7/2007 | Shoji |
| 7,259,545 B2 | 8/2007 | Stauth et al. |
| 7,348,724 B2 | 3/2008 | Lee |
| 7,358,724 B2 | 4/2008 | Taylor et al. |
| 7,476,816 B2 | 1/2009 | Doogue et al. |
| 7,598,601 B2 | 10/2009 | Taylor et al. |
| 7,709,754 B2 | 5/2010 | Doogue et al. |
| 7,768,083 B2 | 8/2010 | Doogue et al. |
| 8,080,994 B2 | 12/2011 | Taylor et al. |
| 8,680,843 B2 | 3/2014 | Ausserlechner |
| 8,760,149 B2 | 6/2014 | Ausserlechner |
| 8,860,153 B2 | 10/2014 | Ausserlechner et al. |
| 8,907,437 B2 | 12/2014 | Milano et al. |
| 9,190,606 B2 | 11/2015 | Liu et al. |
| 10,345,343 B2 * | 7/2019 | Milano ................. H01L 43/02 |
| 2001/0028115 A1 | 10/2001 | Yanagawa et al. |
| 2002/0179987 A1 | 12/2002 | Meyer et al. |
| 2003/0071333 A1 | 4/2003 | Matsuzawa |
| 2003/0155634 A1 | 8/2003 | Yasunaga et al. |
| 2004/0056647 A1 | 3/2004 | Stauth et al. |
| 2004/0080307 A1 | 4/2004 | Ohtsuka |
| 2004/0080308 A1 | 4/2004 | Goto |
| 2004/0113280 A1 | 6/2004 | Kim |
| 2004/0155644 A1 | 8/2004 | Stauth et al. |
| 2005/0029638 A1 | 2/2005 | Ahn et al. |
| 2005/0030018 A1 | 2/2005 | Shibahara et al. |
| 2005/0045359 A1 | 3/2005 | Doogue et al. |
| 2005/0224248 A1 | 10/2005 | Gagnon et al. |
| 2005/0230843 A1 | 10/2005 | Williams |
| 2006/0002147 A1 | 1/2006 | Hong et al. |
| 2006/0071655 A1 | 4/2006 | Shoji |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0181263 A1 | 8/2006 | Doogue et al. |
| 2006/0219436 A1 | 10/2006 | Taylor et al. |
| 2006/0291106 A1 | 12/2006 | Shoji |
| 2007/0044370 A1 | 3/2007 | Shoji |
| 2007/0076332 A1 | 4/2007 | Shoji et al. |
| 2007/0090825 A1 | 4/2007 | Shoji |
| 2007/0096716 A1 | 5/2007 | Shoji |
| 2007/0170533 A1 | 7/2007 | Doogue et al. |
| 2007/0188946 A1 | 8/2007 | Shoji |
| 2007/0279053 A1 | 12/2007 | Taylor et al. |
| 2008/0297138 A1 | 12/2008 | Taylor et al. |
| 2009/0206833 A1 | 8/2009 | Imai et al. |
| 2010/0156394 A1 | 6/2010 | Ausserlechner et al. |
| 2010/0258921 A1 | 10/2010 | Chang Chien et al. |
| 2011/0221429 A1 | 9/2011 | Tamura |
| 2011/0248392 A1 | 10/2011 | Javier et al. |
| 2011/0248711 A1 | 10/2011 | Ausserlechner |
| 2011/0304327 A1 | 12/2011 | Ausserlechner |
| 2011/0316149 A1 | 12/2011 | Suzuki et al. |
| 2013/0020660 A1 | 1/2013 | Milano et al. |
| 2013/0049746 A1 | 2/2013 | Strutz et al. |
| 2014/0151697 A1 | 6/2014 | Ausserlechner et al. |
| 2014/0167736 A1 | 6/2014 | Suzuki et al. |
| 2016/0028001 A1 | 1/2016 | Liu et al. |

(56) References Cited

U.S. PATENT DOCUMENTS

| | | |
|---|---|---|
| 2016/0282388 A1 | 9/2016 | Milano et al. |
| 2017/0138988 A1 | 5/2017 | Ausserlechner |

FOREIGN PATENT DOCUMENTS

| | | |
|---|---|---|
| CN | 103649762 A | 3/2014 |
| DE | 4 141 386 | 6/1993 |
| DE | 10 2008 034 577 | 2/2010 |
| EP | 0 867 725 | 9/1998 |
| EP | 1 107 227 | 6/2001 |
| EP | 1 107 328 | 6/2001 |
| EP | 1 111 693 | 6/2001 |
| EP | 1 180 804 | 2/2002 |
| EP | 1 281 974 | 2/2003 |
| JP | 61-71649 | 4/1986 |
| JP | 63-191069 | 8/1988 |
| JP | 4-364472 | 12/1992 |
| JP | H06140555 A | 5/1994 |
| JP | H06260582 A | 9/1994 |
| JP | H07-147360 A | 6/1995 |
| JP | H08-211138 | 8/1996 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002040058 | 2/2002 |
| JP | 2002202326 | 7/2002 |
| JP | 2002202327 | 7/2002 |
| JP | 2002267692 | 9/2002 |
| JP | 2003-098196 A | 4/2003 |
| JP | 2003-124421 A | 4/2003 |
| JP | 2003130895 | 5/2003 |
| JP | 2003-172750 | 6/2003 |
| JP | 2003-188331 | 7/2003 |
| JP | 2003329749 | 11/2003 |
| JP | 2005-198760 A | 7/2005 |
| JP | 2006186075 A | 7/2006 |
| JP | 2007-503584 A | 2/2007 |
| JP | 2011017713 | 1/2011 |
| JP | 2011069837 | 4/2011 |
| JP | 52-55046 | 8/2013 |
| WO | WO 99/14605 | 3/1999 |
| WO | WO 03/038452 | 5/2003 |
| WO | WO 2005/026749 | 3/2005 |
| WO | WO 2006/130393 | 12/2006 |
| WO | WO 2010103934 | 9/2010 |
| WO | WO 2013/015976 A1 | 1/2013 |
| WO | WO 2013/008462 A1 | 2/2015 |

OTHER PUBLICATIONS

3M Electrical Markets Product Brochure "Electrical, Electronic and EMI, Shielding Tapes Selection Guide", 2007, 12 pages.

Clemson University Vehicular Electronics Laboratory; "Electromagnetic Compatibility;" internet: http://www.cvel.clemson.edu/emc/tutorials/Shielding02/Practical_Shielding.html; Dec. 22, 2009; 9 Pages.

Lee et al.; "Fine Pitch Au—SnAgCu Joint-in-via Flip-Chip Packaging;" IEEE 9th Electronics Packaging Technology Conference, 2007; 7 Pages.

Mosbarger et al.; "The Effects of Materials and Post-Mold Profiles on Plastic Encapsulated Integrated Circuits;" IEEE/IRPS; 1994; 8 pages.

Steiner et al, "Fully Packaged CMOS Current Monitor Using Lead-On-Chip Technology" Physical Electronics Laboratory, ETH Zurich, CH-8093, Switzerland, 0-7803-4412 X98, IEEE 1998, 6 pages.

Underwriters Laboratories Inc. (UL), UL Standard for Safety for Information Technology Equipment—Safety—Part 1: General Requirements, UL 60950-1, Second Edition, dated Mar. 27, 2007, 275 pages.

Underwriters Laboratories Inc. (UL), UL Standard for Safety for Information Technology Equipment—Safety—Part 2: General Requirements, UL 60950-1, Second Edition, dated Mar. 27, 2007, 233 pages.

Wikipedia; "Electromagnetic Field;" internet: http://en.wikipedia.org/wiki/Electromagnetic_field; Dec. 22, 2009; 7 sheets.

Wikipedia; "Electromagnetic Shielding:" internet: http://en.wikipedia.org/wiki/Electromagnetic_shielding; Dec. 22, 2009; 3 pages.

Wikipedia; "Magnetic Field;" internet: http://en.wikipedia.org/wiki/Magnetic_field; Dec. 22, 2009; 25 pages.

Office Action dated Oct. 9, 2018 for Japanese Application No. 2016-209261 with English Translation; 5 Pages.

Response to Office Action dated Oct. 9, 2018 for Japanese Application No. 2016-209261 as filed on Oct. 18, 2018 with English Translation of Claims; 14 Pages.

Notice of Allowance dated Oct. 30, 2018 for Japanese Application No. 2016-209261 with English Translation of Allowed Claims; 10 Pages.

Japanese Office Action with English Translation dated Sep. 11, 2018, for Japanese Application No. 2016-500401; 9 Pages.

Response to European Office Action dated May 17, 2018, for European Application No. 14709845.3 as filed on Sep. 27, 2018; 11 Pages.

Japanese Response with English Translations of Amended Claims for Japanese Application No. 2016-209261 as filed on Aug. 3, 2018; 14 Pages.

European Search Report dated May 17, 2018 for European Application No. 14709845.3; 7 Pages.

Response (with English amended claims) to Japanese Office Action dated Mar. 5, 2018 for Japanese Application No. 2016-500401; Response filed Jun. 5, 2018; 12 Pages.

Japanese Office Action (with English Translation) dated May 9, 2018 for Japanese Application No. 2016-209261; 6 Pages.

Response (with English Translation) to German Office Action dated Dec. 1, 2017 for German Application No. 112012003079.6; Response filed on Apr. 6, 2018; 116 pages.

Japanese Office Action with English Translation dated Mar. 5, 2018 for Japanese Application No. JP 2016-500401; 13 pages.

German Office Action with English Translation dated Dec. 1, 2017 for German Application No. 112012003079.6, 18 pages.

Letter to Yuasa and Hara dated Nov. 17, 2017 for Japanese Application No. 2016-209261; 9 pages.

Japanese Response to Office Action with English claims dated Dec. 14, 2017 for Japanese Application No. 2016-209261; 14 pages.

Japanese Response to Office Action with English claims dated Dec. 25, 2017 for Japanese Application No. 2016-500401, 11 pages.

Japanese Office Action dated Oct. 3, 2017 for Japanese Application No. 2016-500401; 7 pages.

Notice of Allowance dated Oct. 24, 2017 for U.S. Appl. No. 14/877,309; 9 pages.

Japanese Office Action dated Sep. 15, 2017 for Japanese Application No. 2016-209261; 13 pages.

Response to U.S. Non-Final Office Action dated Jan. 30, 2017 for U.S. Appl. No. 14/877,309; Response filed on Apr. 14, 2017; 7 pages.

U.S. Non-Final Office Action dated Jan. 30, 2017 for U.S. Appl. No. 14/877,309; 10 pages.

Preliminary Amendment dated on Feb. 21, 2012 for U.S. Appl. No. 13/188,739; 73 pages.

Restriction Requirement dated Jun. 27, 2013 for U.S. Appl. No. 13/188,739; 7 pages.

Response to Restriction Requirement dated on Jun. 28, 2013 for U.S. Appl. No. 13/188,739; 1 page.

Office Action dated Aug. 16, 2013 for U.S. Appl. No. 13/188,739; 15 pages.

Amendment dated Oct. 23, 2013 for U.S. Appl. No. 13/188,739; 11 pages.

Final Office Action dated Jan. 10, 2014 for U.S. Appl. No. 13/188,739; 15 pages.

Amendment dated Apr. 11, 2014 for U.S. Appl. No. 13/188,739; 10 pages.

(56) References Cited

OTHER PUBLICATIONS

Notice of Allowance dated Oct. 3, 2014 for U.S. Appl. No. 13/188,739; 7 pages.
Search Report and Written Opinion dated Nov. 27, 2012 for PCT Application No. PCT/US2012/046025; 11 pages.
International Preliminary Report on Patentability dated Feb. 6, 2014 for PCT Application No. PCT/US2012/046025; 8 pages.
Japanese Office Action with English translation dated Oct. 23, 2015 for Japanese Application No. 2014-521652; 10 pages.
Response to Japanese Office Action filed on Jan. 8, 2016 with pending claims and letter to Yuasa and Hara dated Dec. 8, 2015 for Japanese Application No. 2014-521652; 12 pages.
Japanese Office Action with English translation dated Jun. 30, 2016 for Japanese Application No. 2014-521652; 5 pages.
Restriction Requirement dated Sep. 17, 2014 for U.S. Appl. No. 13/834,617; 6 pages.
Response to Restriction Requirement dated Nov. 18, 2014 for U.S. Appl. No. 13/834,617; 1 page.
Office Action dated Jan. 9, 2015 for U.S. Appl. No. 13/834,617; 11 pages.
Amendment dated May 7, 2015 for U.S. Appl. No. 13/834,617; 13 pages.
Notice of Allowance dated Aug. 28, 2015 for U.S. Appl. No. 13/834,617; 8 pages.
Search Report and Written Opinion dated Jun. 2, 2014 for PCT Application No. PCT/US2014/018525; 13 pages.
International Preliminary Report on Patentability dated Sep. 24, 2015 for PCT Application No. PCT/US2014/018525; 10 pages.
Response to Written Opinion filed on Apr. 18, 2016 for European Application No. 14709845.3; 14 pages.
Allegro Datasheet ACS712, Fully Integrated, Hall Effect-Based Linear Current Sensor IC with 2.1 kVRMS Isolation and a Low-Resistance Current Conductor, 2006, 14, pages.
Allegro Datasheet ACS758xCB, Thermally Enhanced, Fully Integrated, Hall Effect-Based Linear Current Sensor IC with 100 µΩ Current Conductor, 2008, 19 pages.
Restriction Requirement dated Jan. 13, 2017 for U.S. Appl. No. 15/179,147, 6 pages.
Response to Restriction Requirement filed on Jan. 26, 2017 for U.S. Appl. No. 15/179,147, 1 page.
Office Action dated Sep. 14, 2017 for U.S. Appl. No. 15/179,147, 16 pages.
Response to Office Action filed on Dec. 8, 2017 for U.S. Appl. No. 15/179,147, 14 pages.
Final Office Action dated May 3, 2018 for U.S. Appl. No. 15/179,147, 20 pages.
Request for Continued Examination filed on Jun. 28, 2018 for U.S. Appl. No. 15/179,147, 3 pages.
Response to Final Office Action filed on Jun. 28, 2018 for U.S. Appl. No. 15/179,147, 11 pages.
Office Action dated Dec. 11, 2018 for U.S. Appl. No. 15/179,147, 7 pages.
Response to Office Action filed on Dec. 26, 2018 for U.S. Appl. No. 15/179,147, 8 pages.
Notice of Allowance dated Apr. 23, 2019 for U.S. Appl. No. 15/179,147, 30 pages.
Response (with Machine English Translation) to Korean Office Action dated Jan. 2, 2020 for Korean Application No. 10-2015-7029244; Response filed Feb. 27, 2020; 54 pages.
Response (with Machine English Translation) to Japanese Office Action dated Jan. 22, 2020 for Japanese Application No. 2018-229511; Response filed Mar. 24, 2020; 13 Pages.
Japanese Decision to Grant (with Machine English Translation & Allowed Claims) dated Mar. 30, 2020 for Japanese Application No. 2018-229511; 10 Pages.
Japanese Notice of Reason for Rejection (with English Translation) dated Jan. 22, 2020 for Japanese Application No. 2018-229511; 7 Pages.

\* cited by examiner

CURRENT SENSOR ISOLATION

CROSS-REFERENCE TO RELATED APPLICATIONS

This application is a divisional application and claims the benefit of U.S. patent application Ser. No. 15/179,147, filed on Jun. 10, 2016 and entitled "Current Sensor Isolation," which is a continuation-in-part application of U.S. Pat. No. 9,865,807, issued on Jan. 9, 2018 and entitled "Packaging for an Electronic Device," which is a divisional application of U.S. Pat. No. 9,190,606, issued on Nov. 17, 2005 and entitled "Packaging for an Electronic Device," all of which are incorporated herein by reference in their entirety.

STATEMENT REGARDING FEDERALLY SPONSORED RESEARCH

Not applicable.

FIELD OF THE INVENTION

This invention relates generally to integrated circuit (IC) current sensors that contain magnetic field sensing elements and current conductors, and more particularly, to safety isolation approaches for such current sensors.

BACKGROUND

Safety isolation is an important consideration in the design of any electrical product that can expose its users to potentially hazardous voltage levels. Manufacturers of such products need to ensure that their products are designed to adequately safeguard against electrical shock.

In any safety isolation scheme, there is a certain amount of insulation required to create a protective isolation barrier between primary and secondary circuits. A primary circuit is a circuit that is directly connected to line voltage and therefore has the potential to reach hazardous voltage levels. A secondary circuit is not electrically connected to the primary circuit (that is, there is no conductive connection between the secondary circuit and primary circuit) but could experience hazardous voltage levels if insulation fails.

Underwriters Laboratories Inc. (UL) has developed a safety standard called UL 60950-1 (second edition), which specifies a high level of safety isolation to protect against risk of injury due to electric shock (herein, the "Standard"). The UL 60950-1 Standard is based on the International Electrotechnical Commission (IEC) Standard, IEC 60950-1 (second edition). The UL 60950-1 Standard defines five categories of insulation: functional insulation; basic insulation; supplemental insulation; double insulation; and reinforced insulation. Functional insulation does not protect against electrical shock. Basic insulation is a single level of insulation that provides basic protection against electric shock. Supplemental insulation is independent insulation that can be applied in addition to basic insulation to reduce the risk of electrical shock in the event of a failure of the basic insulation. Double insulation comprises both basic insulation and supplemental insulation. Thus, basic insulation provides a single layer of insulating barrier between primary and secondary circuits, whereas double insulation provides two layers of insulating barrier between primary and secondary circuits. Reinforced insulation is a single insulation system that provides electrical shock protection equivalent to double insulation.

If a secondary circuit is not user accessible, a basic level of isolation protection, that is, basic insulation, may be acceptable. Safety needs for products that include user-accessible secondary circuits, on the other hand, demand two levels of protection provided by double insulation or its equivalent in reinforced insulation.

Although the UL 60950-1 Standard is intended for use with information technology equipment, it has been adopted for many other products and is considered the premier Standard for product designs that require galvanic isolation. One product that requires galvanic isolation is the current sensor.

Some current sensors use one or more magnetic field transducers, or sensing elements (for example, a Hall effect or magnetoresistive transducer) in proximity to a current conductor. The magnetic field transducer generates an output signal having a magnitude proportional to the magnetic field induced by a current that flows through the current conductor. Current sensors with integrated current conductors and magnetic field transducers have a primary conductor (i.e., the current conductor, which has leads connected to a high line voltage via an external current conductor) in close proximity to a secondary conductor (i.e., the lower voltage sensing circuits and signal pins). In applications where the device's primary conductor is connected to line voltages (e.g., 120, 240 or 480 VRMS), maintaining galvanic isolation between the primary and secondary conductors is important.

Some prior magnetic field current sensors are designed to provide basic insulation between the current conductor (which, as mentioned above, connects to line voltage and can be considered a primary conductor or circuit) and other conductive parts of the device that are electrically independent of the primary conductor (e.g., sensing circuits, interconnections and signal pins, which may be considered a secondary conductor or circuit) in the way they are constructed.

Various parameters characterize the performance of such current sensors, including sensitivity. Sensitivity is related to the magnitude of a change in output voltage from the magnetic field transducer in response to a sensed current. The sensitivity of a current sensor is related to a variety of factors. One important factor is the physical separation between the magnetic field transducer and the current conductor. Integration of the current conductor into an IC package allows for close and precise positioning of the current conductor relative to the magnetic field transducer.

The Standard does not specify a minimum thickness through insulation for basic insulation. For insulation to be considered supplemental or reinforced under the Standard, however, the insulation must have a minimum thickness of 0.4 mm. Insulation in the form of a thin sheet material, e.g., "thin film" material, may be used for supplemental and reinforced insulation, irrespective of its thickness, provided that at least two layers of such material are used.

The term "clearance" refers to the shortest distance through air between two conductive parts, such as the primary and secondary leads. The term "creepage" refers to the shortest distance between two conductive parts along the surface of any insulation material common to both parts. The spacing distance between components that are required to withstand a given working voltage (i.e., the highest voltage level that insulation under consideration can be subjected to when a device such as a current sensor is operating under normal use) is specified in terms of creepage and clearance. The creepage requirements and clearance requirements are specified in Table 2N and Tables 2K-2M (of the Standard), respectively. The minimum clearance required for high working voltage ratings is less than the creepage requirement and therefore easier to meet. According to Table 2N, to achieve a rating for an RMS working voltage of 500 V for reinforced or double insulation using a material in material group II, a minimum creepage of 7.2 mm must be achieved.

SUMMARY

A current sensor integrated circuit includes a lead frame having a primary conductor and at least one secondary lead and a semiconductor die disposed adjacent to the primary conductor and comprising a magnetic field sensing circuit to sense a magnetic field associated with a current through the primary conductor and to generate a secondary signal indicative of the current for coupling to the least one secondary lead. An insulation structure is disposed between the primary conductor and the semiconductor die and a non-conductive insulative material encloses the semiconductor die, the insulation structure, a first portion of the primary conductor, and a first portion of the at least one secondary lead to form a package. The insulation structure may extend beyond a periphery of the primary conductor. A second portion of the primary conductor and a second portion of the at least one secondary lead are exposed outside of the package and a distance between the second, exposed portion of the primary conductor and the second, exposed portion of the at least one secondary lead is at least approximately 7.2 mm.

The current sensor integrated circuit may include one or more of the following features. The first portion of the at least one secondary lead between a first end proximal to the primary conductor and a second end proximal to the second, exposed portion of the at least one signal lead may have a thickness that is less than a thickness of the second, exposed portion of the least one secondary lead. The second, exposed portion of the primary conductor and the second, exposed portion of the at least one secondary lead may be disposed on a bottom surface of the package. A distance of any path between the primary conductor and the secondary signal through the non-conductive insulative material may be at least approximately 0.4 mm. The insulation structure may include a first insulation layer and a second insulation layer. Each of the first insulation layer and the second insulation layer may comprise a polyimide film and further may comprise a layer of adhesive. In an embodiment, the polyimide film and the adhesive layer may be provided in the form of a tape.

The current sensor integrated circuit may further comprise a wire bond to couple the secondary signal to the least one secondary lead. In one embodiment, the primary conductor may extend from a first side of the package to a second, opposite side of the package and the second, exposed portion of the at least one signal lead may extend from a third side of the package, orthogonal to the first and second sides of the package. In another embodiment, the second, exposed portion of the primary conductor may extend from a first side of the package and the second, exposed portion of the at least one signal lead may extend from a second side of the package, opposite the first side of the package. The primary conductor may include at least one notch substantially vertically aligned with at least one magnetic field sensing element supported by the semiconductor die.

Also described is a current sensor integrated circuit including a lead frame having a primary conductor and at least one secondary lead, a semiconductor die disposed adjacent to the primary conductor and comprising a magnetic field sensing circuit, an insulation structure disposed between the primary conductor and the semiconductor die, and a non-conductive insulative material enclosing the semiconductor die, the insulation structure, a first portion of the primary conductor, and a first portion of the at least one secondary lead to form a package. The magnetic field sensing circuit senses a magnetic field associated with a current through the primary conductor and generates a secondary signal indicative of the current for coupling to the least one secondary lead. A second portion of the primary conductor and a second portion of the at least one secondary lead are exposed outside of the package and the first portion of the at least one secondary lead (between a first end proximal to the primary conductor and a second end proximal to the second, exposed portion of the at least one secondary lead) has a thickness that is less than a thickness of the second, exposed portion of the least one secondary lead.

Features of the current sensor integrated circuit may include one or more of the following. A distance between the second, exposed portion of the primary conductor and the second, exposed portion of the at least one secondary lead may be at least approximately 7.2 mm. The insulation structure may extend beyond a periphery of the primary conductor to establish a distance of any path between the primary conductor and the secondary lead through the non-conductive insulative material of at least approximately 0.4 mm. The second, exposed portion of the primary conductor and the second, exposed portion of the at least one secondary lead may be disposed on a bottom surface of the package. The insulation structure may comprise a first insulation layer and a second insulation layer. Each of the first insulation layer and the second insulation layer may comprise a polyimide film and further may comprise a layer of adhesive. The polyimide film and the adhesive layer may be provided in the form of a tape.

The current sensor integrated circuit may further include a wire bond to couple the secondary signal to the least one secondary lead. In an embodiment, the primary conductor may extend from a first side of the package to a second, opposite side of the package and the second, exposed portion of the at least one signal lead may extend from a third side of the package, orthogonal to the first and second sides of the package. In another embodiment, the second, exposed portion of the primary conductor may extend from a first side of the package and the second, exposed portion of the at least one signal lead may extend from a second side of the package, opposite the first side of the package. The primary conductor may include at least one notch substantially vertically aligned with at least one magnetic field sensing element supported by the semiconductor die.

BRIEF DESCRIPTION OF THE DRAWINGS

The foregoing features of the invention, as well as the invention itself may be more fully understood from the following detailed description of the drawings, in which like reference numbers refer to like elements and in which.

DETAILED DESCRIPTION

Figure 1:
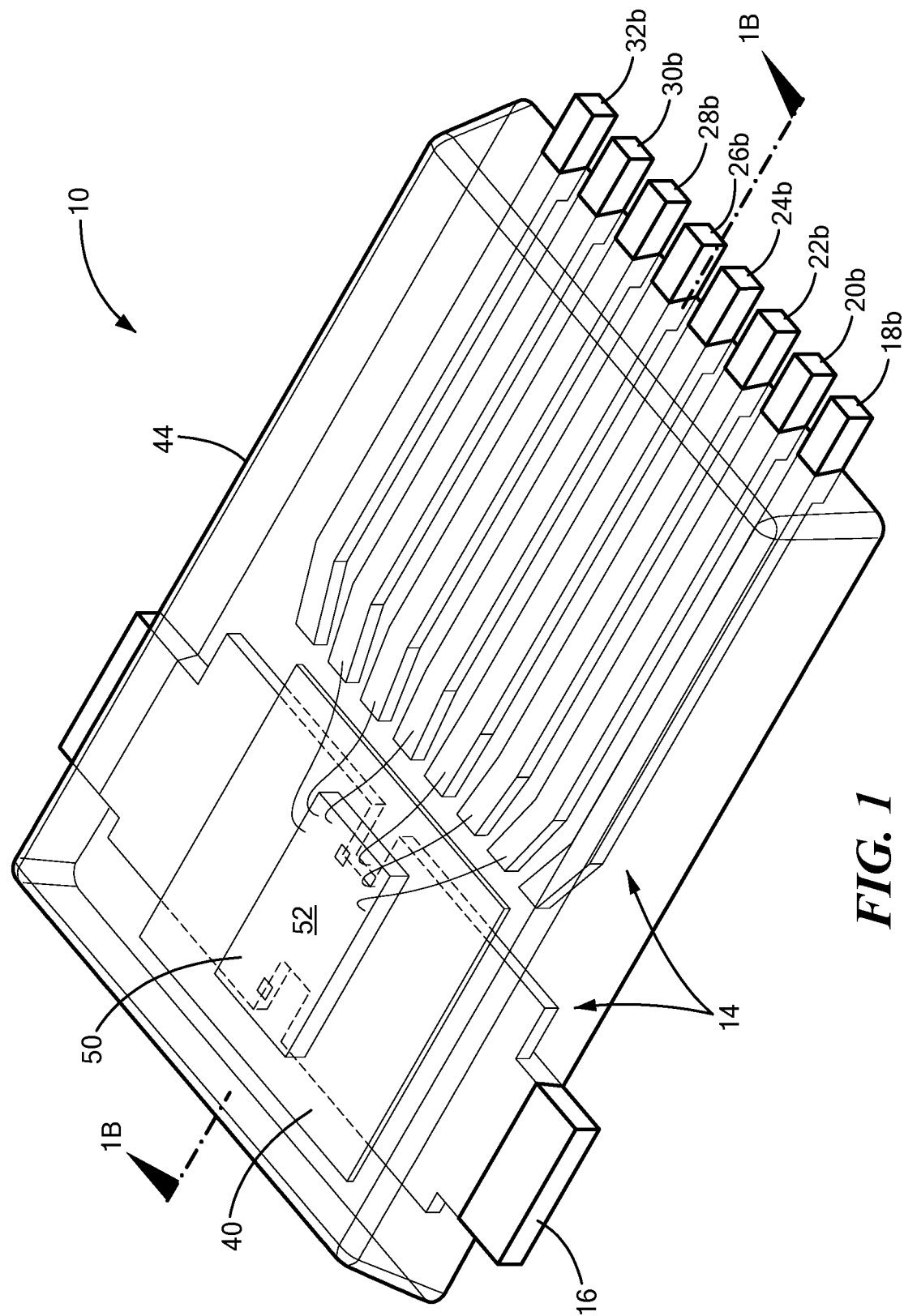
FIG. 1 shows a top perspective view of a current sensor with an integrated current primary conductor.
Figure 1A:
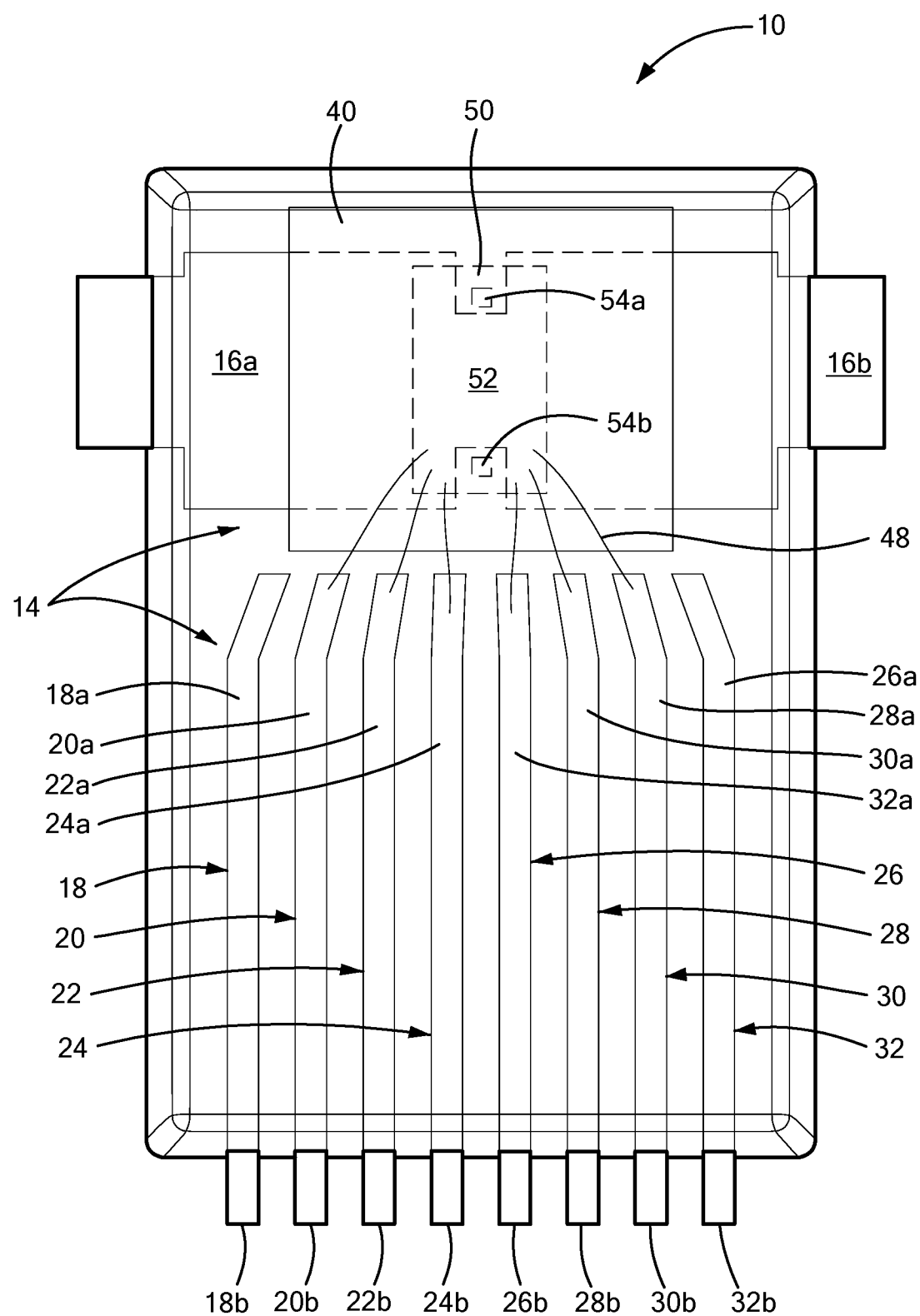
FIG. 1A shows a plan view of the current sensor of FIG. 1.
Figure 1B:
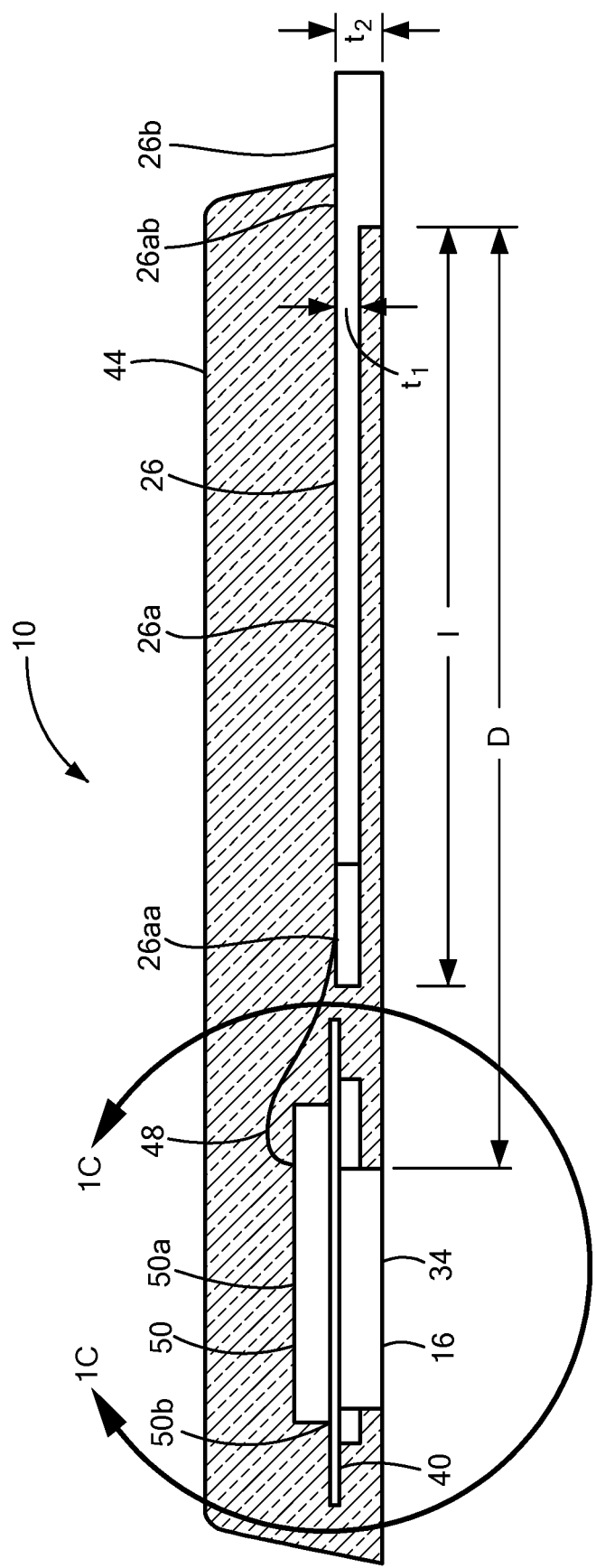
FIG. 1B shows a cross-sectional view of the current sensor of FIG. 1 taken along line 1B-1B of FIG. 1.

Referring to FIGS. 1, 1A, and 1B, a current sensor integrated circuit 10 has a lead frame 14 including a primary conductor 16 and at least one secondary lead 18 (and here a plurality of secondary leads 18-32). A semiconductor die 50 is disposed adjacent to the primary conductor 16 and includes a magnetic field sensing circuit 52 (FIG. 6) to sense a magnetic field associated with a current through the primary conductor 16 and to generate a secondary signal indicative of the current for coupling to at least one secondary lead. An insulation structure 40 is disposed between the primary conductor 16 and the semiconductor die 50. A non-conductive insulative material 44 (shown in phantom) encloses the semiconductor die 50, the insulation structure 40, a first portion 16a of the primary conductor 16, and a first portion 18a-32a of the secondary leads 18-32 to form an integrated circuit package. A second portion 16b of the primary conductor 16 including a bottom surface 34 (FIG. 1B) of the primary conductor and a second portion 18b-32b of the secondary leads 18-32 are exposed outside of the package, such that a distance "D" (FIG. 1B) between the exposed bottom surface of the primary conductor 16 and the second, exposed portions 18b-32b of the secondary leads 18-32 is at least approximately 7.2 mm.

The insulation structure 40 is disposed between the primary conductor 16 and the semiconductor die 50. The insulation structure 40 may extend beyond a periphery of the primary conductor 16 by a distance of at least approximately 0.4 mm in one embodiment, as will be explained.

Considering the cross-sectional view of FIG. 1B and illustrative signal lead 26 shown therein, the first enclosed portion 26a of the secondary lead 26 (having a length "l" between a first end 26aa proximal to the primary conductor 16 to a second end 26ab proximal to the second, exposed portion 26b of the signal lead 26) has a thickness "t1" that is less than a thickness "t2" of the second, exposed portion 26b of the secondary lead 26. Accordingly, the enclosed first portion 18a-32a of secondary leads 18-32 can be referred to as a "thinned" or "recessed" portions.

With the described arrangement, reinforced isolation according to the Standard is achieved for working voltages as high as 500 VRMS since any path between primary and secondary conductors through a single layer of insulation is at least 0.4 mm and also since the thinned portions of the secondary leads are designed so that the shortest distance between primary and secondary conductors along the surface of any insulation material common to both parts (i.e., the creepage distance) and the shortest distance between primary and secondary conductors through air (i.e., the clearance distance) is at least 7.2 mm. It will be appreciated that the creepage distance can be readily varied by stretching or shortening the length of the enclosed portions 18a-32a of the secondary leads in order to achieve a desired isolation value. Features of the lead frame specifically and of the current sensor generally will be explained further in connection with following figures that illustrate the current sensor at various stages of fabrication.

Considering FIG. 1A, the magnetic field sensing circuit 52 supported by the semiconductor die 50 includes one or more magnetic field sensing elements, and here elements 54a and 54b. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

In operation, when a current flows through the primary conductor 16, the magnetic field sensing elements 54a, 54b convert the sensed magnetic field into a proportional voltage. An output based on that voltage is made available at one or more of the secondary leads 18-32 as will be explained further in connection with the example magnetic field sensing circuit 52 of FIG. 6.

The magnetic field sensing circuit 52 is electrically coupled to one or more of secondary leads 18-32 by an interconnect 48. In the illustrated embodiment, the interconnect takes the form of wire bonds 48 and the die is positioned over the primary conductor 16 in a "die up" configuration in which the magnetic field sensing elements 54a, 54b are supported on a die surface 50a distal from the primary conductor 16. In order to accommodate soldering of the wire bonds 48, bond pads may be provided on the die surface 50a and on the secondary signal leads. In alternative embodiments, the current sensor may take the form of a "flip chip" configuration in which the magnetic field sensing elements 54a, 54b are supported on a die surface 50b proximal to the primary conductor 16. In a flip chip configuration, the interconnect may take the form of solder balls or solder bumps.

The non-conductive package material 44 may be formed by transfer molding from a plastic material that has insulation properties and thus, may alternatively be referred to as a plastic or mold material. The plastic package material is grouped into one of three categories under UL60950-1, material I, II and III. An insulating material is classified into a material group by its CTI (Comparative Tracking Index) test result. If the insulation material is not CTI tested, the UL60950-1 considers it to be a material group III material. Material group III is the lowest classification and results in the lowest working voltage rating. Accordingly, a material group II classified molding compound such as Sumitomo E670C, could be selected for use in the current sensor. Other molding compounds, e.g., Henkel MG-52F, if CTI tested to achieve material group II classification, might be suitable choices as well. The selection of a plastic classified as a material group II is important because the 500 VRMS working voltage rating may not be achievable in the design with material group III insulation material. There are material group I classification materials also available.

Referring now to the several views shown in FIGS. 2, 2A, 2B, and 2C, various features of the current sensor lead frame 14 will be described. Lead frame 14 includes primary conductor 16 and secondary leads 18-32. The primary conductor 16 may have various shapes and dimensions to accommodate a range of current levels sought to be detected by the current sensor and the desired IC package footprint. The bottom surface 34 (FIG. 2C) of the primary conductor 16 may be exposed (i.e., not encapsulated by the insulative material 44 of FIG. 1). This exposed surface 34 may be soldered, welded, crimped, or otherwise electrically coupled to a surface mount bond pad on a printed circuit board (PCB) or current carrying conductor or other structure and by its relative large dimensions, including its thickness, permits a relatively high current range level to be detected by the current sensor 10, such as on the order of 200 amps. In use, a current flow is established through the primary conductor 16 between terminal ends 16ba and 16bb.

The top surface 36 of the primary conductor 16 may take a somewhat different shape than the bottom surface 34 and as a result, there may be thinned regions 38 (FIG. 2C) of the primary conductor. Such thinned regions 38 may serve to enhance adhesion of the non-conductive insulative material 44 to the primary conductor, thereby serving as a "locking mechanism" to facilitate the primary conductor being secured within the non-conductive insulative material 44 of the package.

The primary conductor 16 may have at least one notch 46 substantially vertically aligned with at least one magnetic field sensing element 54a, 54b supported by the semiconductor die 50. Notch(es) 46 may concentrate the magnetic field on the sensing elements 54a, 54b. It will be appreciated that additional notches and sensing elements may be provided, such as a centrally located notch and sensing element disposed between notches 46 and sensing elements 54a, 54b.

Each of the secondary leads 18-32 is elongated from a first respective end proximal to the primary conductor 16 to a second end distal from the primary conductor 16. One or more of the elongated secondary leads 18-32 may extend substantially straight from its first end to its second end or one or more such leads may have a slight jog adjacent to its first end as labeled 18c, 20c, 22c, 28c, 30c, and 32c.

Figure 2A:
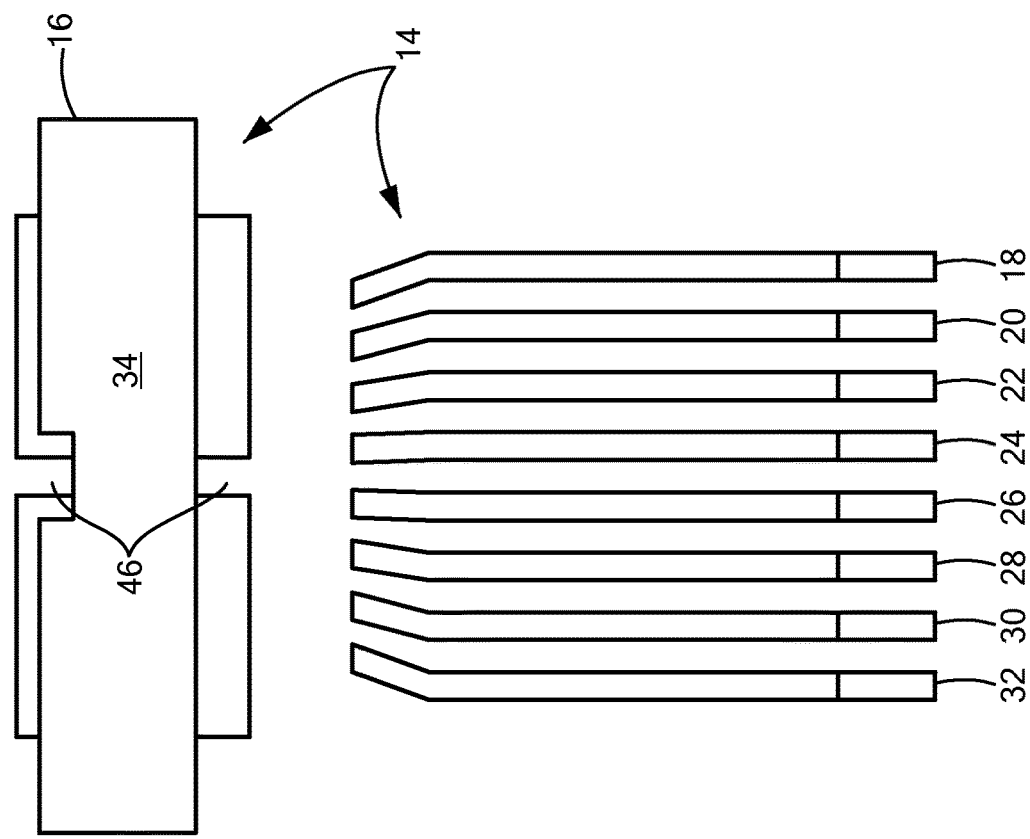
FIG. 2A shows a bottom view of the lead frame of the current sensor of FIG. 1.
Figure 2:
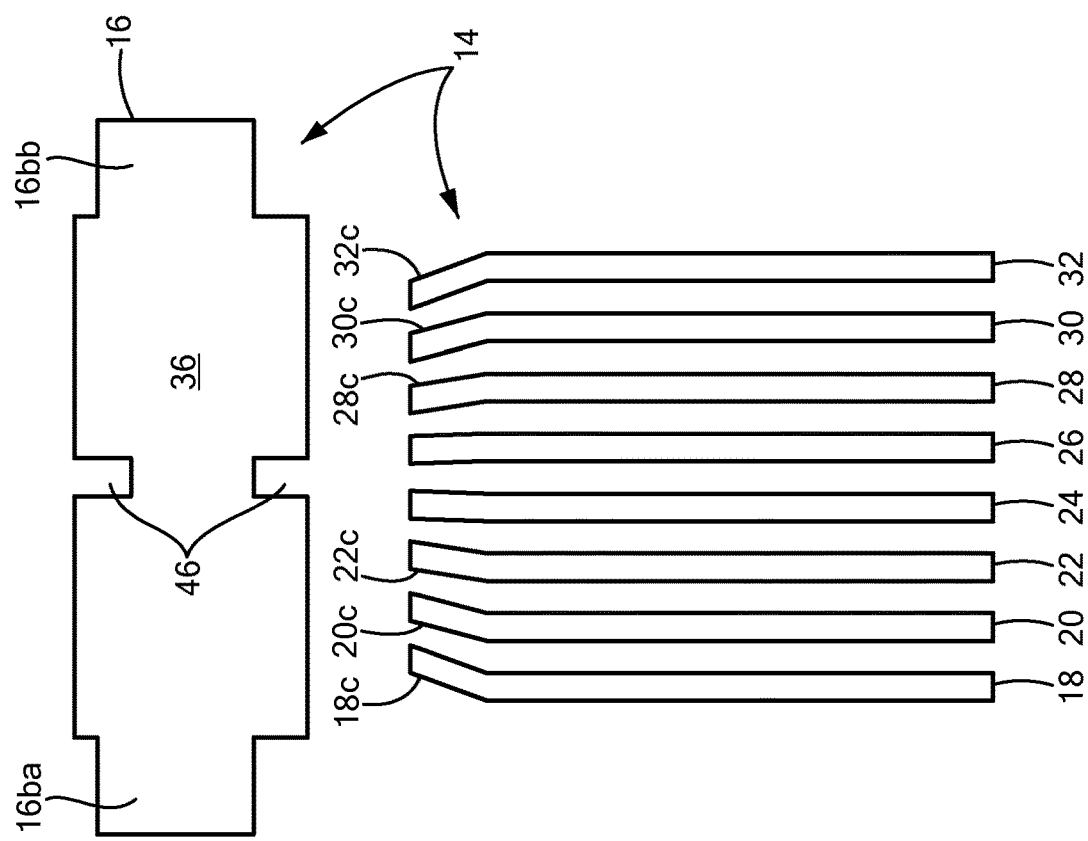
FIG. 2 shows a top view of the lead frame of the current sensor of FIG. 1.
Figure 2B:
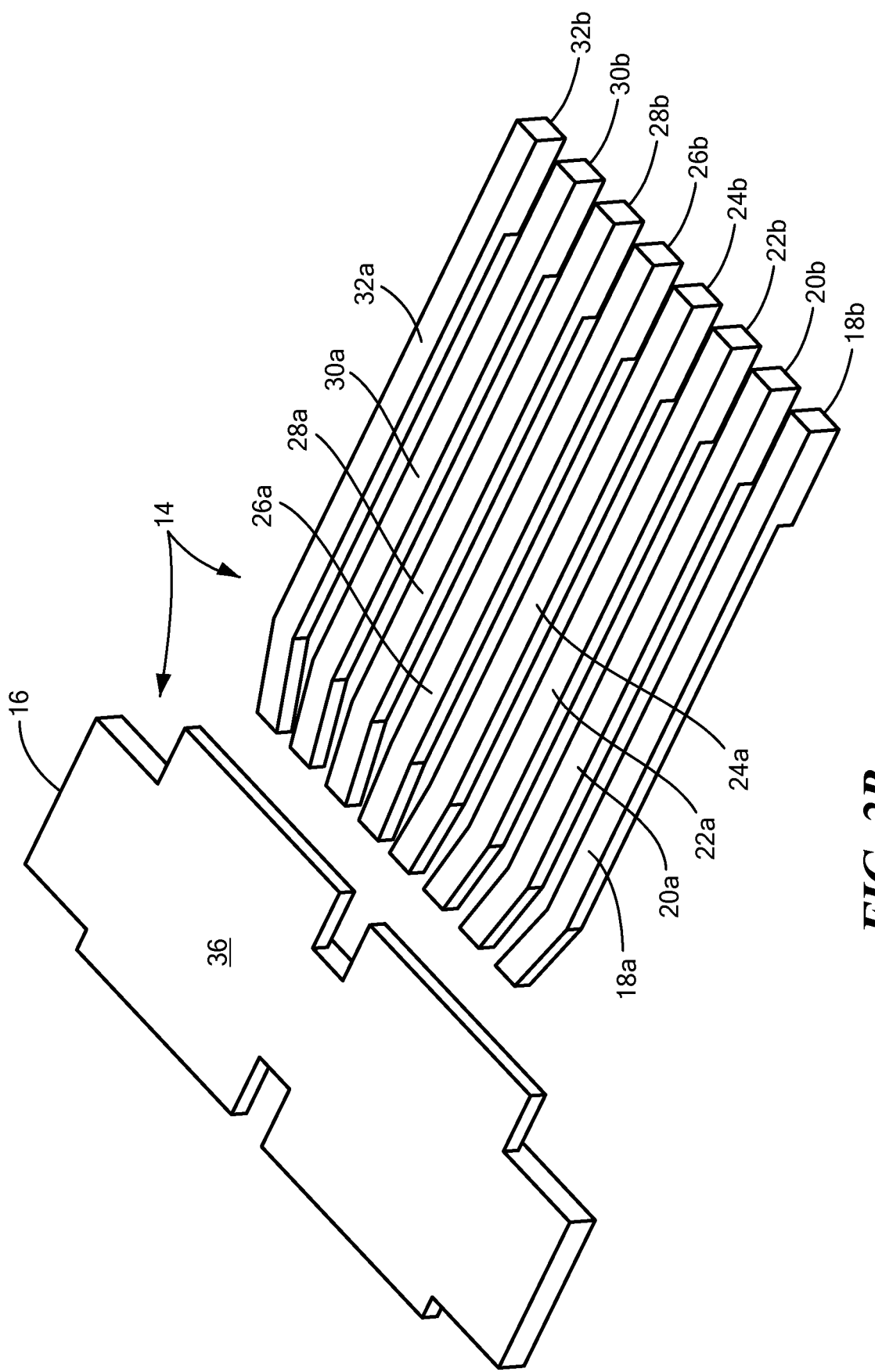
FIG. 2B shows a top perspective view of the lead frame of the current sensor of FIG. 1.
Figure 2C:
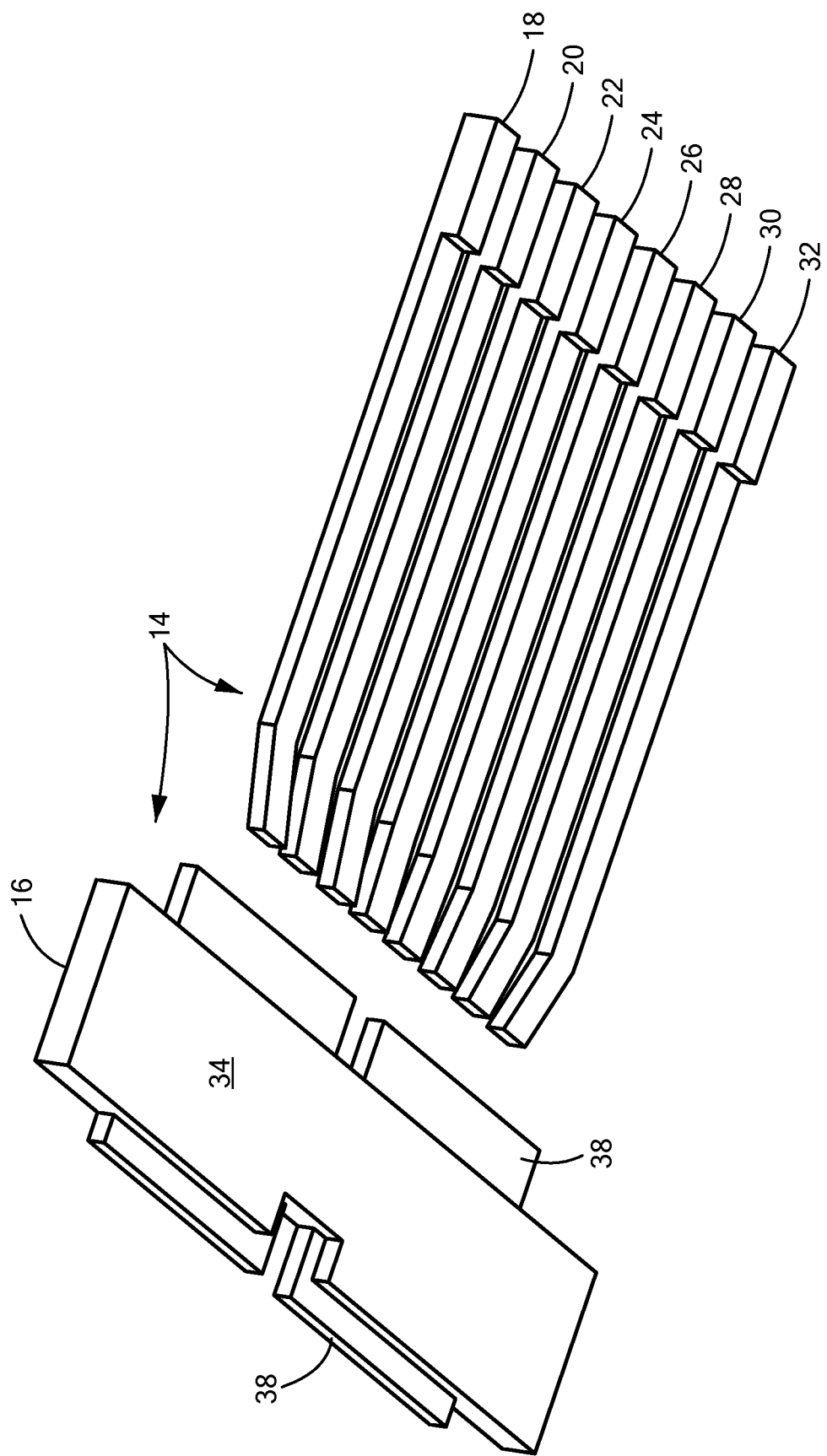
FIG. 2C shows a bottom perspective view of the lead frame of the current sensor of FIG. 1.

Referring specifically to the perspective lead frame views of FIGS. 2B and 2C and also the cross-sectional view of FIG. 1B, it can be seen that one or more (and here all) of the secondary leads 18-32 has a thinner portion and a thicker portion. More specifically and with reference to example secondary lead 26, the first portion 26a of secondary lead 26 which extends between a first end 18aa proximal to the primary conductor 16 to a second end 26ab proximal to the second, exposed portion 26b of the secondary lead 26 (and which portion 26a is enclosed by the non-conductive insulative material 44 as shown in FIG. 1) has a thickness "t1" that is less than a thickness "t2" of the second, exposed portion 26b of the secondary lead 26. With this arrangement, once the non-conductive insulative material 44 is applied to the current sensor subassembly, the secondary lead portions 18a-32a are encapsulated by the non-conductive insulative material, thereby facilitating meeting the creepage and clearance requirements of the Standard (as compared to conventional secondary leads that are not so thinned). An additional feature of the signal leads 18-32 that facilitates compliance with the Standard is the overall length of the enclosed portions 18a-32a (e.g., length "l" in FIG. 1B), which length in one illustrative embodiment is on the order of 6.5 mm.

The thinned portions 18a-32a can be formed by an etching process. The etching process may include applying a photoresist to a surface of a metal substrate, performing photolithography on the metal substrate, performing a first etch on one surface of the metal substrate, performing a second etch on a second, opposite surface of the metal substrate, and removing the photoresist. Referring also to FIG. 1, thereafter, the insulation structure 40 may be attached to the primary conductor 16, the die 50 may be attached to the insulation structure 40, the wirebonds 48 attached, and finally the plastic material 44 formed. The metal substrate may comprise any suitably strong and conductive, such as copper or copper alloy. Also, fabrication techniques other than the above-described etching process may be used to form the lead frame 14 and its described features, such as a stamping (coining) process, milling or laser processes. Additional details of such an example etching process can be found in above-referenced U.S. Pat. No. 9,190,606 for example.

It will be appreciated that the thinned portions 18a-32a of the secondary leads may additionally serve to enhance adhesion of the non-conductive insulative material 44 to the lead frame in the sense of a "locking mechanism." It also will be appreciated that although the lead frame 14 is shown to have eight secondary leads 18-32, other numbers, dimensions, and configurations of leads are possible. For example, in some applications fewer secondary leads may be provided, as may simplify electrical coupling (e.g., by soldering) of the leads to a PCB and other PCB design parameters, for example. Additionally, other primary conductors 16 are likewise possible.

Figure 3A:
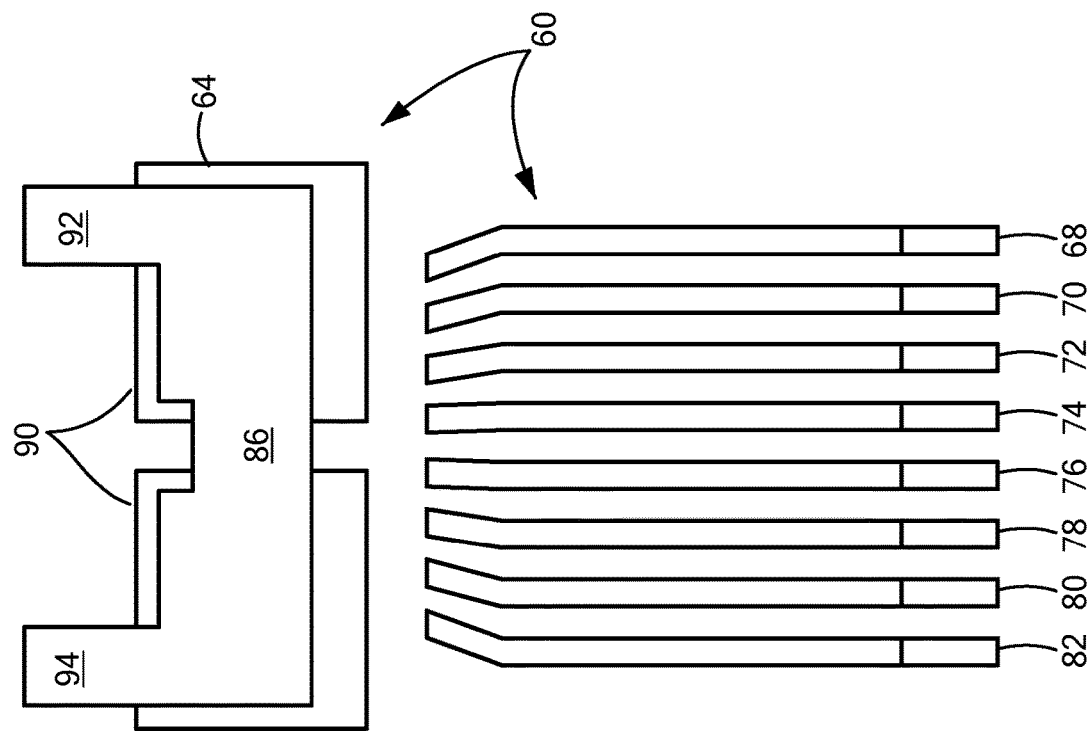
FIG. 3A shows a bottom view of the alternative lead frame of FIG. 3.
Figure 3:
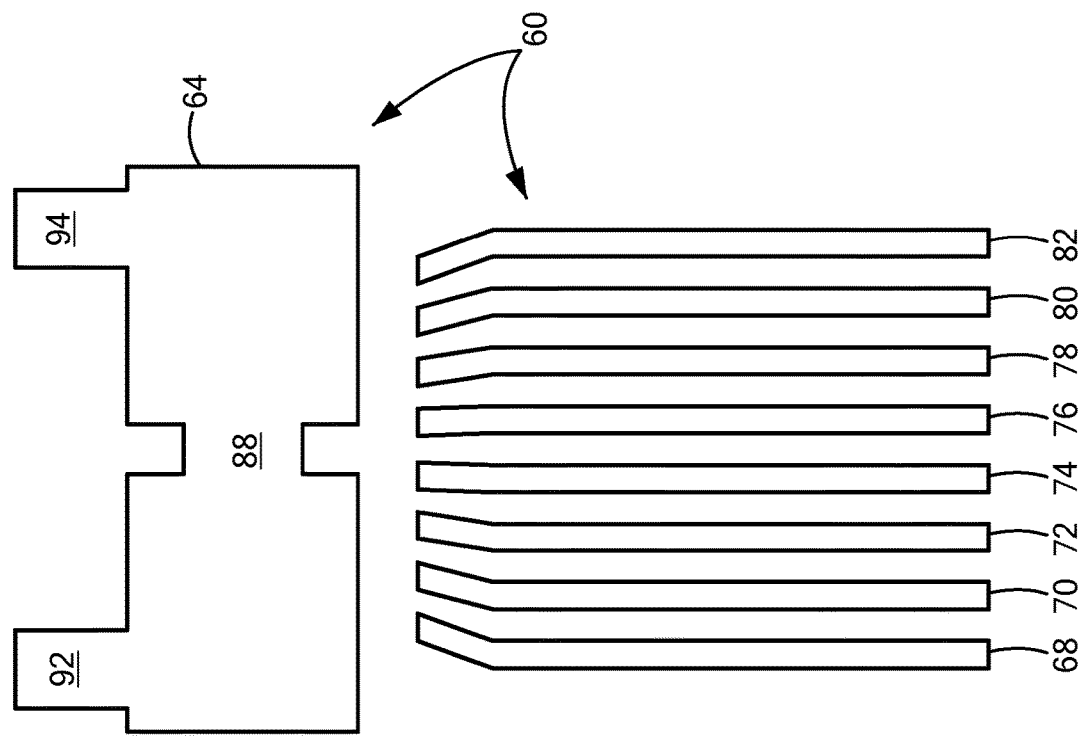
FIG. 3 shows a top view of an alternative lead frame for the current sensor of FIG. 1.

Referring also to FIGS. 3 and 3A, an alternative lead frame 60 includes an alternative primary conductor 64 having a bottom surface 86 and a top surface 88 and at least one secondary lead 68 (and here a plurality of secondary leads 68-82). Similar to bottom surface 34 of lead frame 14 (FIGS. 2-2C), in assembly, the bottom surface 86 may be exposed (i.e., not encapsulated by the non-conductive insulative material) for electrical coupling, such as by soldering, to a surface mount bond pad of a printed circuit board for example. Furthermore, similar to top surface 36 of lead frame 14 (FIGS. 2-2C), top surface 88 of the primary conductor 64 may take a somewhat different shape than the bottom surface 86 and as a result, there may be thinned regions 90 of the primary conductor, as may enhance adhesion of the non-conductive insulative material to the primary conductor as described above in connection with FIGS. 2-2C. Secondary leads 68-82 may be the same as or similar to secondary leads 18-32 of FIGS. 2-2C for example.

Lead frame 60 differs from lead frame 14 (FIGS. 2-2C) mainly in the configuration of the primary conductor 64. In particular, terminal ends 92, 94 of primary conductor 64 are substantially orthogonal with respect to like ends of primary conductor 16. This alternative arrangement accommodates different complementary bond pads (e.g., surface mount bond pads) on a circuit board or other structure to which the resulting current sensor IC may be attached.

Figure 4A:
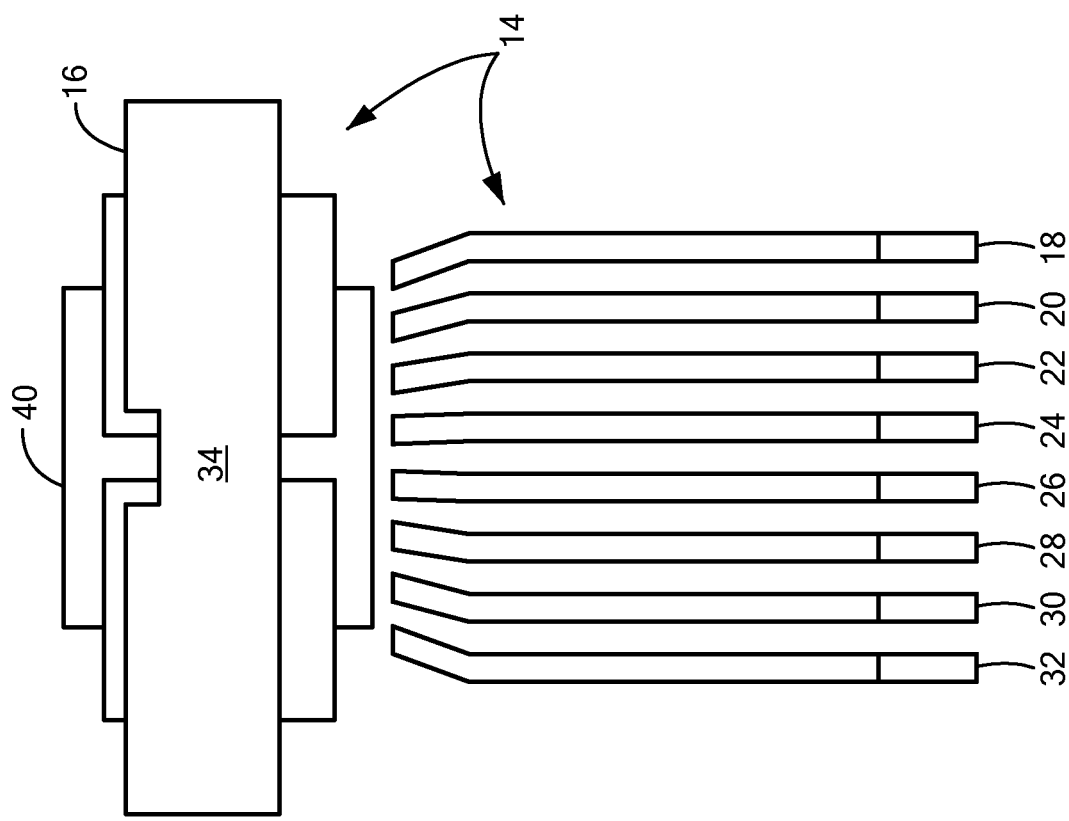
FIG. 4A shows a bottom view of the lead frame and insulation structure of FIG. 4.
Figure 4:
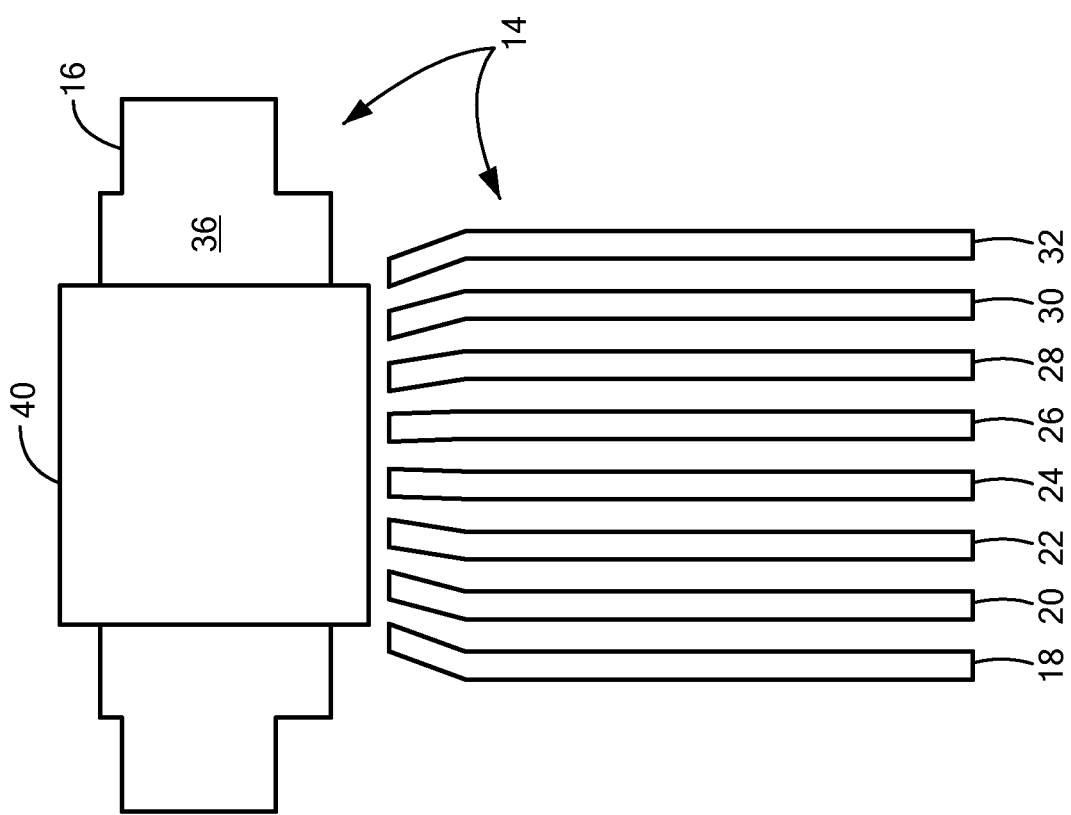
FIG. 4 shows a top view of the lead frame of FIG. 2 with an insulation structure.

Referring also to FIGS. 4 and 4A, the current sensor 10 is shown at a later stage of manufacture at which the insulation structure 40 is attached to the lead frame 14 and in particular to the primary conductor 16. The insulation structure 40 is provided to electrically isolate the current conductor 16 from the semiconductor die 50 (FIG. 1). The insulation structure 40 may be formed on or applied to the current conductor 16 and the die 50 placed on top of the insulation-covered current conductor, according to one possible assembly technique.

The insulation structure 40 may take various forms. As an example, as shown in the enlarged, cross-sectional view of FIG. 1C, the insulation structure 40 may be formed by two layers of insulating material, a first layer 40a and a second layer 40b. Each layer may include thin sheet material, e.g., an organic polymer such as polyimide or benzo-cyclobutene (BCB), or an oxide insulating material like silicon dioxide (if such material can be provided in two layers, or a single layer deposited twice to form the double layer). The double layered structure provides basic and supplemental insulation layers, or reinforced insulation in a single package. The two layers may be separable or non-separable. Each layer must be able to pass high voltage "type" testing at the required withstand voltage. If the layers are non-separable layers, the two-layer insulation will be tested at 200% required withstand voltage. If the layers are separable, then each layer of insulation can be tested at 100% required withstand voltage. In terms of material and/or thickness, the layers may be the same or different.

In an embodiment, each insulation layer 40a, 40b may be provided as a tape layer. The first tape layer 40a may include a first polyimide film layer and a first adhesive layer. The second tape layer 40b may include a second polyimide film layer and a second adhesive layer. From bottom (i.e., adjacent to the primary conductor 16) to top (i.e., adjacent to the die 50), the order of the layers is adhesive layer (which is in contact with the current conductor 16), the polyimide film layer 40a, another adhesive layer, and the polyimide film layer 40b. The die 50 is in contact with the polyimide film layer 40a. The thicknesses of the tape layers 40a, 40b may be the same (or substantially the same) or different. Likewise, the thickness of the adhesive layer and the polyimide film layer in one layer may be the same as or different from the corresponding layers in the other tape layer. The same type of tape may be used for both layers, in which case the composition and dimensions of the two layers will be the same (or substantially the same). Each layer can include only polyimide film. One type of tape that may be used for each of the tape layers 40a, 40b is the R Series semiconductor adhesive tape available from Tomegawa Co., Ltd., of Japan. One of these tapes, marketed under the product number "R-740", has a polyimide layer thickness of 25 um and an adhesive layer thickness of 15 um. This tape provides a particularly high level of isolation per layer. It has an insulation property of approximately 330 KV per millimeter of thickness. Each layer of polyimide film is 25 microns and can therefore provide 330 KV*0.025 or 8.25 KV of isolation between the primary and the secondary conductors.

If tape is used as the thin sheet insulation layer, each layer may be applied separately, that is, the first layer applied to the top surface of the current conductor 16 and the second layer applied to the first layer, or together (double layer of tape applied to the current conductor). In a flip chip assembly, the tape could be applied to the die before it is attached to the lead frame instead of being applied to the current conductor. Alternatively, in a non-tape implementation, each layer of thin sheet material may be deposited or otherwise formed on the top surface of the current conductor 16 using conventional deposition processes such as spin coating or sputtering. Such processing would also need to coat the sides of the current conductor to form the overhang portion of the insulation.

In order for the current sensor to pass the Standard's testing for reinforced insulation and achieve a high working voltage rating of 500 VRMS, each single layer of tape (or other thin sheet) must survive 4800 VRMS for 60 seconds. This voltage is the required withstand voltage defined earlier. A 4800 VRMS signal has a peak voltage of approximately 6800 V. Each layer of insulation should survive this test. Thus, although each thin layer could be slightly thinner or thicker, it should be thick enough to survive 7 KV or better for high reliability. The use of double layers provides the supplemental insulation that will achieve the reinforced insulation rating, as mentioned above. Additional details of insulation structure 40 may be found in U.S. Pat. No. 8,907,437, entitled "Reinforced Isolation for Current Sensor with Magnetic Field Transducer," issued on Dec. 9, 2014 and assigned to the Assignee of the subject application, which patent is hereby incorporated herein by reference in its entirety.

Figure 1C:
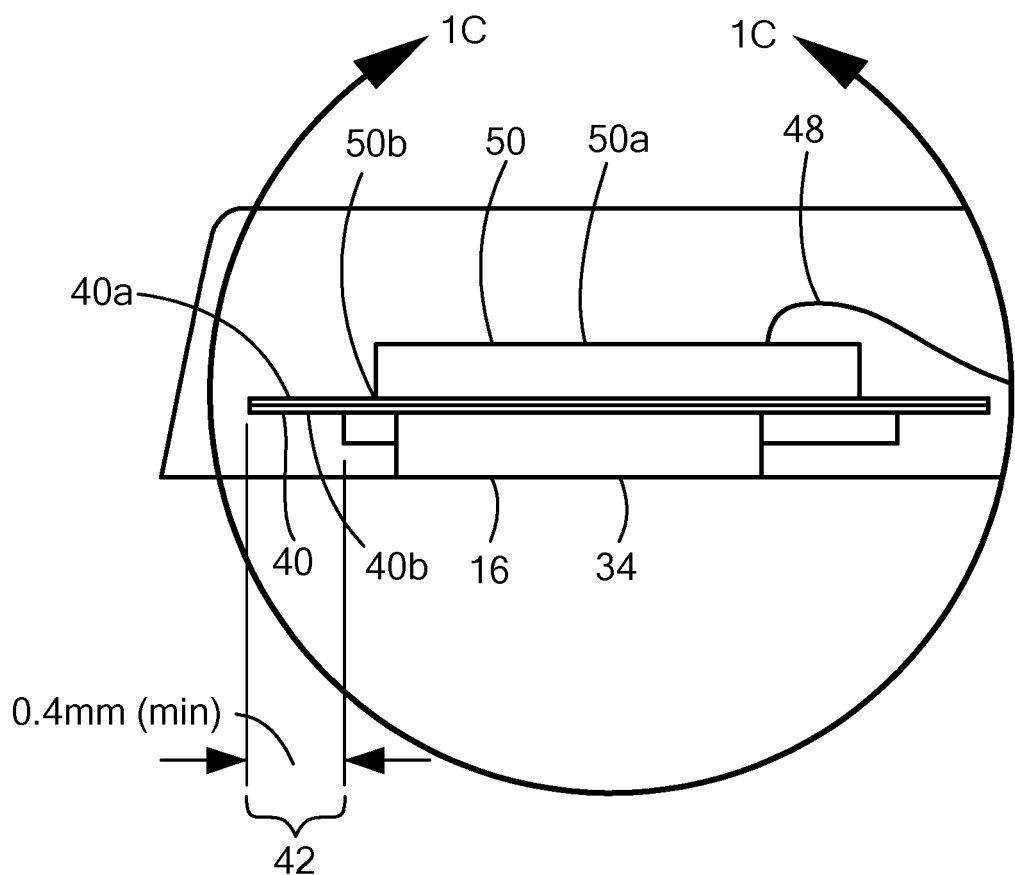
FIG. 1C shows an enlarged view of a portion of FIG. 1B.

As noted above, the insulation structure 40 may extend beyond (i.e., overhang) a periphery of the primary conductor 16. As also mentioned above, reinforced insulation requires that any path between primary and secondary conductors through a single layer of insulation must be a minimum of 0.4 mm. This 0.4 mm requirement applies to a single layer of insulation (that is not a thin sheet insulating layer, which does not have a minimum thickness requirement, as noted above), and the plastic molding compound of the package is considered a single layer of insulation. The view of FIG. 1C shows that the insulation structure 40 can be used to create a path of at least 0.4 mm from primary to secondary conductor through the molding plastic 44. This minimum 0.4 mm path can be achieved by having the insulation structure 40 overhang the primary conductor by a minimum of 0.4 mm. This "overhang" dimension is indicated by reference numeral 42. It will be appreciated that the distance by which the insulation 40 must overhang the primary conductor to achieve the minimum 0.4 mm path length may vary (and in fact may be less than 0.4 mm in some configurations) depending on the dimensions and relative placement of the die 50, primary conductor 16, wire bonds 48 and tolerances, for example. As a result, there is no path from any point on the primary conductor to any secondary point, including the die 50 and the signal leads 18-32, through the plastic 44 that is less than 0.4 mm.

The overall size and shape of the insulation structure 40 varies with the size/shape of the die 50 and underlying current conductor 16. One dimension that is critical is the overhang dimension necessary to achieve the 0.4 mm minimum path length from primary to secondary (i.e., the amount by which the structure extends beyond the current conductor). The amount of overhang may vary within certain practical limits, for example, a tolerance of +/−0.15 mm, to take into account any imperfections or inherent variability in manufacturing processes. The 0.4 mm minimum path dimension is a required minimum that includes all tolerances. Thus, the primary to secondary path length may be larger but must be at least 0.4 mm after tolerancing. At minimum, the insulation structure 40 must be sized and shaped to cover at least that portion of the current conductor that lies underneath the die 50. In the illustrated construction, that portion of the insulation structure has a substantially rectangular shape. The substantially rectangular periphery of the insulation structure extends beyond a corresponding substantially rectangular periphery of the current conductor by at least an amount sufficient to achieve the minimum 0.4 mm path length (after tolerancing, as noted above).

The use of double layering of insulation between the die 50 and current conductor 16 in this design is advantageous, since the performance of the IC current sensor is a function of the physical separation between the magnetic field generating source 16 and magnetic field sensing elements 54a, 54b. The smaller the spacing between the die 50 (and more specifically, the magnetic field sensing elements 54a, 54b) and the current conductor 16, the more optimal the signal coupling will be. If a single layer of insulation were used in this region it would need to meet the 0.4 mm requirement, and a 0.4 mm distance separating the die from the current conductor would result in extremely poor signal coupling between current conductor and transducer. At the same time, the structure's shape/size with overhang portion guarantees compliance with the 0.4 mm requirement in areas of the package that rely only on a single layer of package body plastic for protective insulation. Thus, with one structure, dimensioned to have a thickness and composition designed to meet double insulation between some primary and secondary conductive parts or portions where close proximity between the two is important, and an area (size) that ensures that the distance through insulation between all other primary and secondary conductive parts or portions is at least 0.4 mm, construction requirements under the Standard for reinforced insulation are met.

Figure 5:
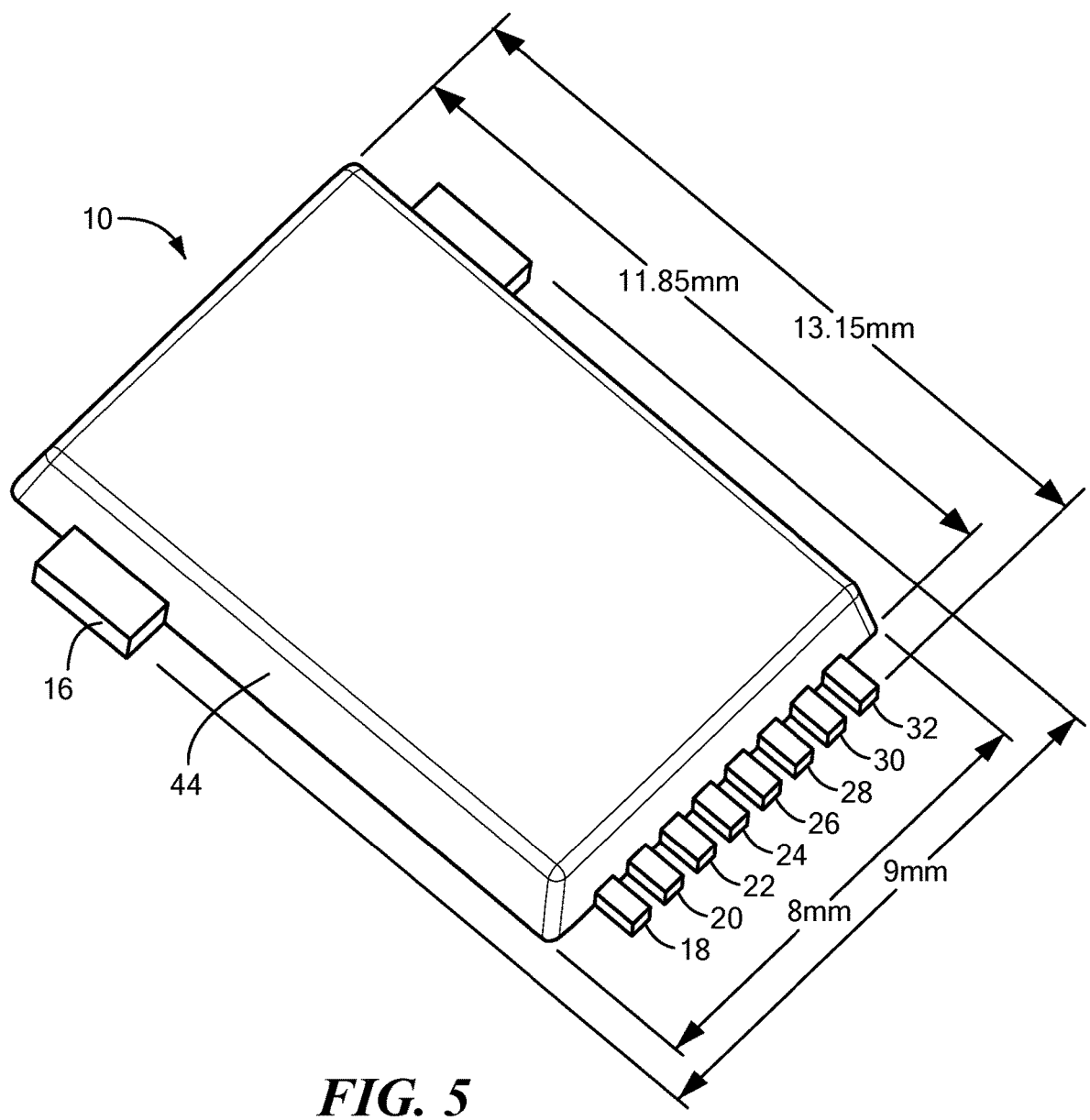
FIG. 5 shows a top perspective view of the packaged current sensor of FIG. 1.
Figure 5A:
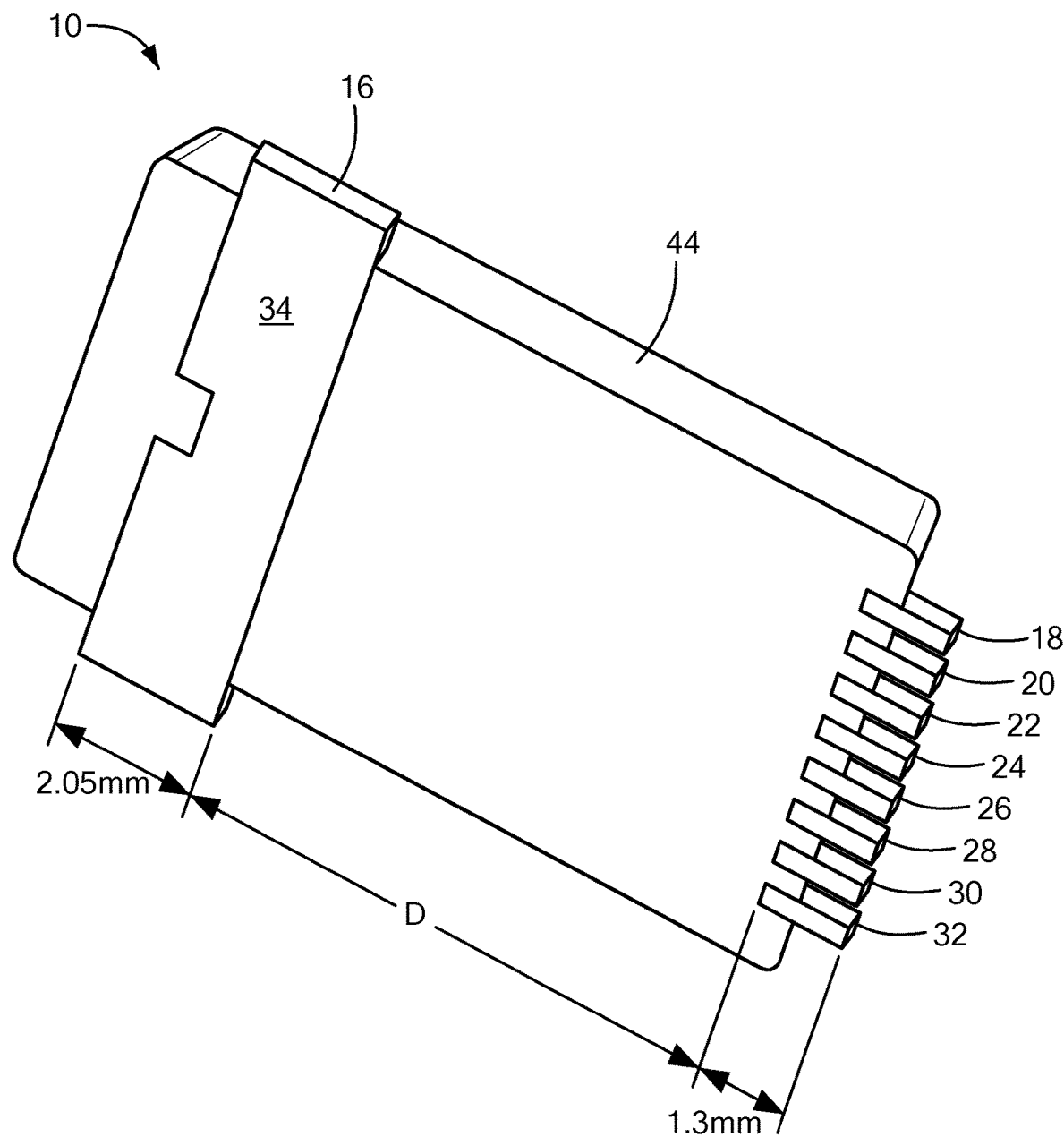
FIG. 5A shows a bottom perspective view of the packaged current sensor of FIG. 1.

Referring to the top and bottom perspective views of the resulting, packaged IC current sensor 10 of FIGS. 5 and 5A, respectively, in an embodiment, the package has a body length of 11.85 mm+/−0.1 mm and a width, lead tip to lead tip, of 9.0 mm+/−0.1 mm and a body width of 8.0 mm+/−0.1 mm. As shown in FIG. 5A, moving along the package from the exposed primary conductor portion 34 to the exposed secondary lead portions 18b-32b yields a creepage (i.e., a dimension "D") of 8.0 mm. The package therefore easily meets the 7.2 mm minimum creepage required for a 500 VRMS working voltage.

When the package is soldered to a PCB, the PCB solder pads may further decrease the creepage (and clearance). This distance between the solder pads on which the primary conductor surface 34 and the exposed secondary lead portions 18b-32b is the actual creepage for the package in the application. The creepage can be improved somewhat by putting a slit in the PCB (not shown) to improve the distance along the PCB from primary to secondary solder pads.

In sum, the current sensor 10 has a design that is capable of achieving a reinforced rating, in particular, for high working voltages (for example, working voltages at least as high as 500 VRMS). As discussed above, the thinned portions of the secondary leads facilitate packaging of the current sensor with dimensions to enable maintaining at least a 7.2 mm creepage distance. The current sensor 10 further features an insulation structure with a construction that includes: a) a double layer of thin sheet material; and b) an overhang dimension that provides a minimum of 0.4 mm distance from primary to secondary components through the package plastic. Therefore, because of the construction of the insulation structure, the double thin sheet insulation and the plastic insulation of the package are compliant to reinforced insulation requirements of the Standard. Also, the package plastic is selected to be a material classified under the Standard as a group II material.

Figure 6:
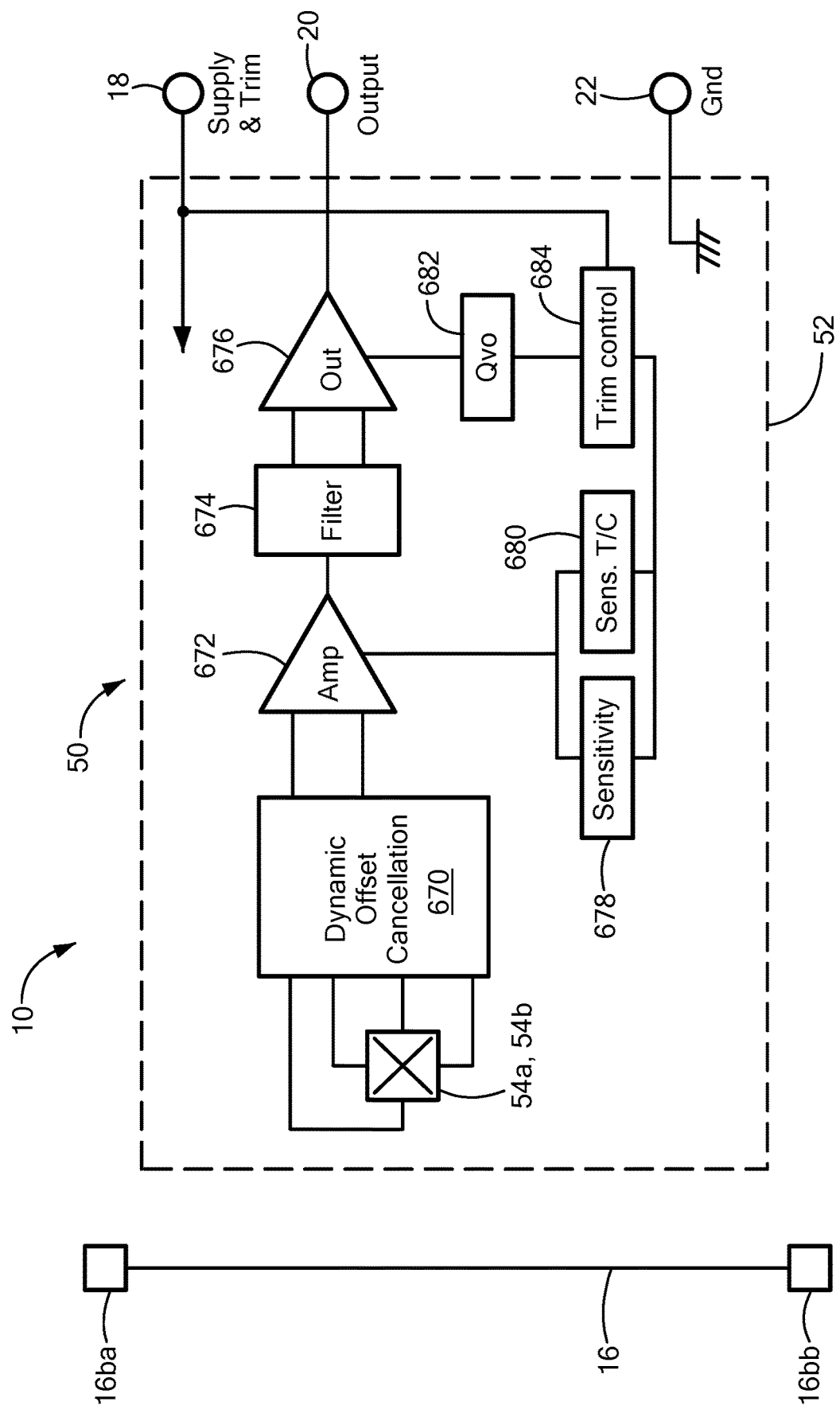
FIG. 6 shows an example block diagram of the current sensor of FIG. 1.

Referring to FIG. 6, a block diagram of the current sensor 10 is shown to include magnetic field sensing circuit 52 having one or more magnetic field sensing elements (and here two such elements 54a, 54b) for sensing a current flow, which may include differential sensing, through the primary conductor 16 between terminal end 16ba and 16bb. Magnetic field sensing circuit 52 may be supported by semiconductor die 50. Secondary signal connections from the die are labeled 18, 20, 22 corresponding to secondary leads 18, 20, 22. Lead 18 may provide a power connection to the circuit 52, lead 20 may provide a connection to a current sensor output signal indicative of a sensed primary current, and lead 22 may provide a reference, or ground connection to the circuit 52.

The magnetic field sensing element(s) 54a, 54b may be coupled to a dynamic offset cancellation circuit 670, which provides a DC offset adjustment for DC voltage errors associated with the Hall effect element(s) 54a, 54b. When the current through the primary conductor 16 is zero, the output of the dynamic offset cancellation circuit 670 is adjusted to be zero.

The dynamic offset cancellation circuit 670 may be coupled to an amplifier 672 that amplifies the offset-adjusted Hall output signal. The amplifier 672 may be coupled to a filter 674 that can be a low pass filter, a high pass filter, a band pass filter, and/or a notch filter. The filter is selected in accordance with a variety of factors including, but not limited to, desired response time, the frequency spectrum of the noise associated with the magnetic field sensing element(s) 54a, 54b, the dynamic offset cancellation circuit 670, and the amplifier 672. In one particular embodiment, the filter 674 is a low pass filter. The filter 674 may be coupled to an output driver 676 that provides an enhanced power output for transmission to other electronics (not shown).

A trim control circuit 684 may be coupled to lead 18 through which power is provided during operation. Lead 18 may also permit various current sensor parameters to be trimmed, typically during manufacture. To this end, the trim control circuit 684 includes one or more counters enabled by an appropriate signal applied to the lead 18.

The trim control circuit 684 may be coupled to a quiescent output voltage (Qvo) circuit 682. The quiescent output voltage is the voltage at output lead 20 when the current through conductor 16 is zero. Nominally, for a unipolar supply voltage, Qvo is equal to Vcc/2. Qvo can be trimmed by applying a suitable trim signal through the lead 18 to a first trim control circuit counter within the trim control circuit 684 which, in turn, controls a digital-to-analog converter (DAC) within the Qvo circuit 682.

The trim control circuit 684 may be further coupled to a sensitivity adjustment circuit 678. The sensitivity adjustment circuit 678 may permit adjustment of the gain of the amplifier 672 in order to adjust the sensitivity of the current sensor 10. The sensitivity can be trimmed by applying a suitable trim signal through the lead 18 to a second trim control circuit counter within the trim control circuit 684 which, in turn, controls a DAC within the sensitivity adjustment circuit 678.

The trim control circuit 684 may be further coupled to a sensitivity temperature compensation circuit 680. The sensitivity temperature compensation circuit 680 permits adjustment of the gain of the amplifier 672 in order to compensate for gain variations due to temperature. The sensitivity temperature compensation can be trimmed by applying a suitable trim signal through the lead 18 to a third trim control circuit counter within the trim control circuit 684 which, in turn, controls a DAC within the sensitivity temperature compensation circuit 680.

It will be appreciated by those of ordinary skill in the art that the circuitry shown in FIG. 6 is illustrative only of exemplary circuitry that may be associated with and integrated into a current sensor. In another embodiment, additional circuitry may be provided for converting the sensor into a "digital fuse" which provides a high or low output signal depending on whether the magnetic field induced by the current through the primary conductor 16 is greater or less than a predetermined threshold level. The additional circuitry for this alternative embodiment can include a comparator and/or a latch, and/or a relay.

Figure 7:
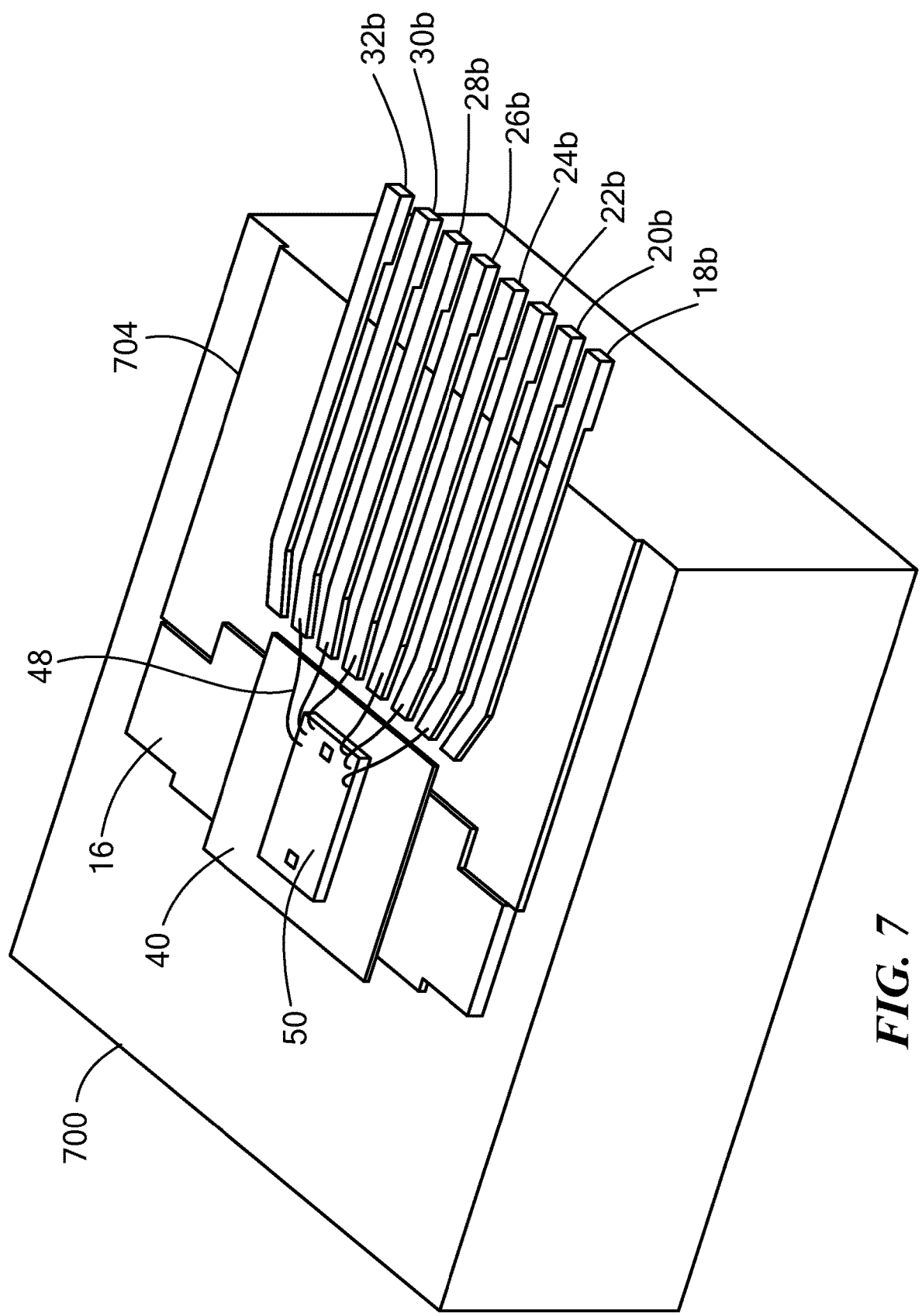
FIG. 7 shows a top perspective view of the current sensor of FIG. 1 placed on a work holder during fabrication.

Referring to FIG. 7, the current sensor 10 is shown during an intermediate stage of manufacture, when wire bonds 48 are coupled between the semiconductor die 50 and the adjacent ends of secondary leads 18-32. Because of the relatively long length of the secondary leads 18-32, a work holder 700 is used to support the current sensor subassembly (prior to encapsulation with non-conductive insulative material 44). Holder 72 includes a step or jog 704 in order to accommodate the thicker exposed secondary lead portions 18b-32b. With this arrangement, the sensor subassembly rests on the work holder with the long secondary leads 18-32 laying flat.

Figure 8:
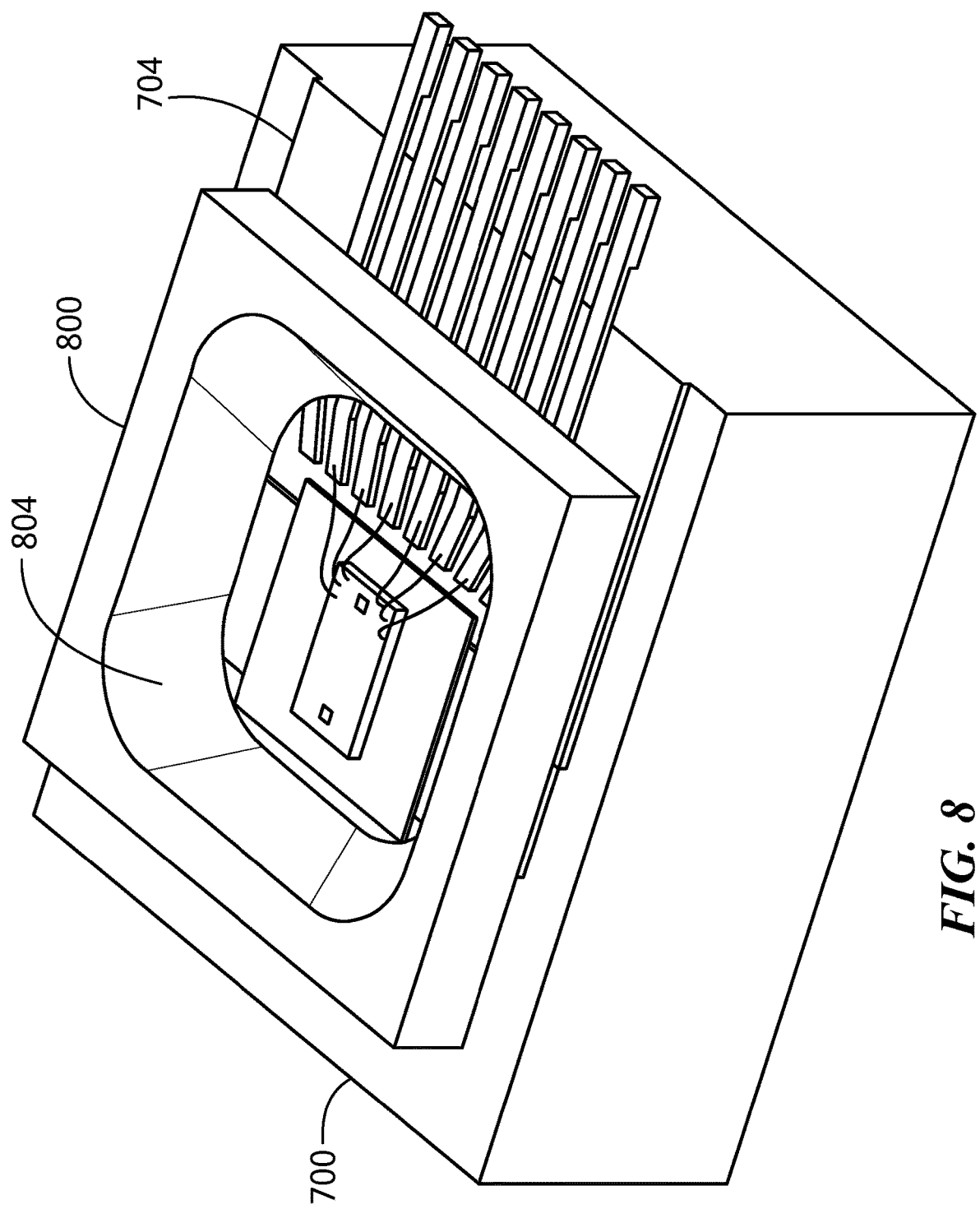
FIG. 8 shows a top perspective view of the current sensor of FIG. 1 placed on the work holder of FIG. 7 with a window clamp during fabrication.

Referring to FIG. 8, an additional feature of the work holder 700 includes a window clamp 800 that includes a window 804 configured to expose the bond pads of the semiconductor die 50 and secondary leads 18-32 to further facilitate soldering the wire bonds 48.

All references cited herein are hereby incorporated herein by reference in their entirety. Having described preferred embodiments of the invention, it will now become apparent to one of ordinary skill in the art that other embodiments incorporating their concepts may be used. For example, while the illustrated current sensor configurations are die up configurations, it will be appreciated that the features described herein may be desirable for use in flip chip configurations. It is felt therefore that these embodiments should not be limited to disclosed embodiments, but rather should be limited only by the spirit and scope of the appended claims.

What is claimed is:

1. A current sensor integrated circuit comprising:
   a lead frame having a primary conductor with a first surface, a second, substantially flat opposing surface, and at least one thinned region, the lead frame further having at least one secondary lead;
   a semiconductor die disposed adjacent to the primary conductor and comprising a magnetic field sensing circuit to sense a magnetic field associated with a current through the primary conductor and to generate a secondary signal indicative of the current for coupling to the least one secondary lead;
   an insulation structure disposed between the primary conductor and the semiconductor die; and
   a non-conductive insulative material enclosing the semiconductor die, the insulation structure, the first surface of the primary conductor, the at least one thinned region of the primary conductor, and a first portion of the at least one secondary lead to form a package, wherein the second substantially flat surface of the primary conductor extends from a first side of the package, wherein the insulation structure extends beyond a periphery of the primary conductor, wherein the second substantially flat surface of the primary conductor and a second portion of the at least one secondary lead are exposed outside of the package, wherein the second portion of the at least one secondary lead extends from a second side of the package, opposite the first side of the package, and wherein a distance between the second substantially flat surface of the primary conductor and the second portion of the at least one secondary lead is at least approximately 7.2 mm.

2. The current sensor integrated circuit of claim 1, wherein the first portion of the at least one secondary lead has a thickness that is less than a thickness of the second portion of the least one secondary lead.

3. The current sensor integrated circuit of claim 1, wherein the second substantially flat surface of the primary conductor and the second portion of the at least one secondary lead are disposed on a bottom surface of the package.

4. The current sensor integrated circuit of claim 1, wherein a distance of any path between the primary conductor and the at least one secondary lead through the non-conductive insulative material is at least approximately 0.4 mm.

5. The current sensor integrated circuit of claim 1, wherein the insulation structure comprises a first insulation layer and a second insulation layer.

6. The current sensor integrated circuit of claim 5, wherein each of the first insulation layer and the second insulation layer comprises a polyimide film.

7. The current sensor integrated circuit of claim 6, wherein each of the first insulation layer and the second insulation layer comprises a layer of adhesive.

8. The current sensor integrated circuit of claim 7, wherein the polyimide film and the adhesive layer are provided in the form of a tape.

9. The current sensor integrated circuit of claim 1, further comprising a wire bond to couple the secondary signal to the least one secondary lead.

10. The current sensor integrated circuit of claim 1, wherein the second portion of the at least one secondary lead extends from a third side of the package, orthogonal to the first and second sides of the package.

11. The current sensor integrated circuit of claim 1, wherein the primary conductor comprises at least one notch substantially vertically aligned with at least one magnetic field sensing element supported by the semiconductor die.

12. A current sensor integrated circuit comprising:
    a lead frame having a primary conductor with a first surface, a second, substantially flat opposing surface, and at least one thinned region, the lead frame further having at least one secondary lead;
    a semiconductor die disposed adjacent to the primary conductor and comprising a magnetic field sensing circuit to sense a magnetic field associated with a current through the primary conductor and to generate a secondary signal indicative of the current for coupling to the least one secondary lead;
    an insulation structure disposed between the primary conductor and the semiconductor die; and a non-conductive insulative material enclosing the semiconductor die, the insulation structure, the first surface of the primary conductor, the at least one thinned region of the primary conductor, and a first portion of the at least one secondary lead to form a package, wherein the second substantially flat surface of the primary conductor extends from a first side of the package, wherein the second substantially flat surface of the primary conductor and a second portion of the at least one secondary lead are exposed outside of the package, wherein the second portion of the at least one signal lead extends from a second side of the package, opposite the first side of the package, and wherein the first portion of the at least one secondary lead has a thickness that is less than a thickness of the second portion of the least one secondary lead.

13. The current sensor integrated circuit of claim 12, wherein a distance between the second substantially flat surface of the primary conductor and the second portion of the at least one secondary lead is at least approximately 7.2 mm.

14. The current sensor integrated circuit of claim 12, wherein the insulation structure extends beyond a periphery of the primary conductor to establish a distance of any path between the primary conductor and the secondary signal through the non-conductive insulative material of at least approximately 0.4 mm.

15. The current sensor integrated circuit of claim 12, wherein the second substantially flat surface of the primary conductor and the second portion of the at least one secondary lead are disposed on a bottom surface of the package.

16. The current sensor integrated circuit of claim 12, wherein the insulation structure comprises a first insulation layer and a second insulation layer.

17. The current sensor integrated circuit of claim 16, wherein each of the first insulation layer and the second insulation layer comprises a polyimide film.

18. The current sensor integrated circuit of claim 17, wherein each of the first insulation layer and the second insulation layer comprises a layer of adhesive.

19. The current sensor integrated circuit of claim 18, wherein the polyimide film and the adhesive layer are provided in the form of a tape.

20. The current sensor integrated circuit of claim 12, further comprising a wire bond to couple the secondary signal to the least one secondary lead.

21. The current sensor integrated circuit of claim 12, wherein the primary conductor comprises at least one notch substantially vertically aligned with at least one magnetic field sensing element supported by the semiconductor die.

* * * * *

UNITED STATES PATENT AND TRADEMARK OFFICE
CERTIFICATE OF CORRECTION

PATENT NO. : 10,753,963 B2
APPLICATION NO. : 16/426215
DATED : August 25, 2020
INVENTOR(S) : Shaun Milano et al.

It is certified that error appears in the above-identified patent and that said Letters Patent is hereby corrected as shown below:

On the Title Page

Item (57) Abstract, Line 13 delete "of the least" and replace with --of the at least--.

In the Specification

Column 3, Line 16 delete "to the least" and replace with --to the at least--.

Column 3, Line 36 delete "of the least" and replace with --of the at least--.

Column 3, Line 50 delete "to the least" and replace with --to the at least--.

Column 4, Lines 9-10 delete "to the least" and replace with --to the at least--.

Column 4, Line 17 delete "of the least" and replace with --of the at least--.

Column 4, Line 38 delete "to the least" and replace with --to the at least--.

Column 5, Line 67 delete "portions." and replace with --portion.--.

Column 6, Line 17 delete "with following" and replace with --with the following--.

Column 7, Line 37 delete "relative large" and replace with --relatively large--.

Column 8, Lines 33-34 delete "conductive, such" and replace with --conductive material, such--.

Column 12, Line 16 delete "end" and replace with --ends--.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,753,963 B2

In the Claims

Column 13, Line 65 delete "to the least" and replace with --to the at least--.

Column 14, Line 22 delete "of the least" and replace with --of the at least--.

Column 14, Lines 45-46 delete "to the least" and replace with --to the at least--.

Column 14, Line 65 delete "to the least" and replace with --to the at least--.

Column 15, Line 15 delete "of the least" and replace with --of the at least--.

Column 16, Line 20 delete "to the least" and replace with --to the at least--.